US008466479B2

(12) United States Patent
Chu et al.

(10) Patent No.: US 8,466,479 B2
(45) Date of Patent: Jun. 18, 2013

(54) LIGHT EMITTING DIODES (LEDS) WITH IMPROVED LIGHT EXTRACTION BY ROUGHENING

(75) Inventors: Chen-Fu Chu, Hsinchu (TW); Hao-Chun Cheng, Donggang Township, Pingtung County (TW); Feng-Hsu Fan, Jhonghe (TW); Wen-Huang Liu, Guan-Xi Town (TW); Chao-Chen Cheng, Hsinchu (TW)

(73) Assignee: SemiLEDs Optoelectronics Co., Ltd., Chu-Nan, Miao-Li County (TW)

( * ) Notice: Subject to any disclaimer, the term of this patent is extended or adjusted under 35 U.S.C. 154(b) by 0 days.

(21) Appl. No.: 12/986,946

(22) Filed: Jan. 7, 2011

(65) Prior Publication Data

US 2011/0101400 A1 May 5, 2011

Related U.S. Application Data

(60) Division of application No. 11/956,962, filed on Dec. 14, 2007, now Pat. No. 7,897,420, which is a continuation-in-part of application No. 11/690,443, filed on Mar. 23, 2007, now Pat. No. 7,524,686, which is a continuation-in-part of application No. 11/618,468, filed on Dec. 29, 2006, now Pat. No. 7,563,625, which is a continuation-in-part of application No. 11/032,880, filed on Jan. 11, 2005, now Pat. No. 7,186,580.

(51) Int. Cl.
*H01L 33/00* (2010.01)
*H01L 21/00* (2006.01)

(52) U.S. Cl.
USPC .............................................. 257/98; 438/29

(58) Field of Classification Search
USPC ........ 438/22, 29, 42, 48; 257/88–98, E21.125, 257/E21.216
See application file for complete search history.

(56) References Cited

U.S. PATENT DOCUMENTS

| | | | |
|---|---|---|---|
| 3,954,534 A | 5/1976 | Scifres et al. | |
| 4,482,442 A | 11/1984 | Kohl et al. | |
| 5,448,107 A | 9/1995 | Osada et al. | |
| 5,779,924 A * | 7/1998 | Krames et al. | 216/24 |
| 5,793,062 A | 8/1998 | Kish, Jr. et al. | |
| 5,801,404 A | 9/1998 | Kahen et al. | |
| 6,023,413 A | 2/2000 | Umezawa | |
| 6,071,795 A | 6/2000 | Cheung et al. | |
| 6,161,910 A | 12/2000 | Reisenauer et al. | |
| 6,221,683 B1 | 4/2001 | Nirschl et al. | |
| 6,277,665 B1 | 8/2001 | Ma et al. | |
| 6,429,460 B1 | 8/2002 | Chen et al. | |
| 6,455,930 B1 | 9/2002 | Palanisamy et al. | |
| 6,535,385 B2 | 3/2003 | Lee | |

(Continued)

OTHER PUBLICATIONS

I. Schnitzer, et al., "30% External Quantum Efficiency from Surface Textured, Thin-Film Light-Emitting Diodes," Appl. Phys. Lett. Oct. 1993 vol. 63 (16): pp. 2174-2176.

(Continued)

*Primary Examiner* — Calvin Lee
(74) *Attorney, Agent, or Firm* — Patterson & Sheridan, L.L.P.

(57) ABSTRACT

Systems and methods are disclosed for fabricating a semiconductor light-emitting diode (LED) device by forming an n-doped gallium nitride (n-GaN) layer on the LED device and roughening the surface of the n-GaN layer to extract light from an interior of the LED device.

20 Claims, 26 Drawing Sheets

U.S. PATENT DOCUMENTS

| | | | |
|---|---|---|---|
| 6,561,261 B2 | 5/2003 | Wagner | |
| 6,614,172 B2 | 9/2003 | Chiu et al. | |
| 6,649,440 B1 | 11/2003 | Krames et al. | |
| 6,658,041 B2 | 12/2003 | Uebbing | |
| 6,713,862 B2 | 3/2004 | Palanisamy et al. | |
| 6,744,071 B2 | 6/2004 | Sano et al. | |
| 6,770,542 B2 | 8/2004 | Plossl et al. | |
| 6,791,117 B2 * | 9/2004 | Yoshitake et al. | 257/94 |
| 6,800,500 B2 | 10/2004 | Coman et al. | |
| 6,821,804 B2 | 11/2004 | Thibeault et al. | |
| 6,828,529 B1 | 12/2004 | Wu | |
| 7,026,659 B2 * | 4/2006 | Slater et al. | 257/98 |
| 7,123,796 B2 | 10/2006 | Steckl et al. | |
| 7,186,580 B2 | 3/2007 | Tran et al. | |
| 7,563,625 B2 | 7/2009 | Tran et al. | |
| 7,897,420 B2 * | 3/2011 | Chu et al. | 438/29 |
| 2002/0097962 A1 | 7/2002 | Yoshimura et al. | |
| 2003/0178626 A1 | 9/2003 | Sugiyama et al. | |
| 2004/0134788 A1 | 7/2004 | Cohen et al. | |
| 2004/0135158 A1 | 7/2004 | Hon | |
| 2004/0245535 A1 | 12/2004 | D'Evelyn et al. | |
| 2004/0245543 A1 | 12/2004 | Yo | |
| 2006/0154391 A1 | 7/2006 | Tran et al. | |
| 2008/0142814 A1 | 6/2008 | Chu et al. | |

OTHER PUBLICATIONS

A. Kock, et al., "Strongly Directional Emission from AlGaAs/GaAs Light-Emitting Diodes," Appl. Phys. Lett. Nov. 1990 vol. 57: pp. 2327-2329.

PCT International Search Report dated Jun. 2, 2008.

Lee, et al. "Effect of Electrical Annealing on the Luminous Efficiency of Thermally Annealed Polymer Light-Emmitting Diodes," Appl. Phys. Lett., Nov. 2000, vol. 77(21): Abstract.

PCT International Search Report dated May 22, 2008.

* cited by examiner

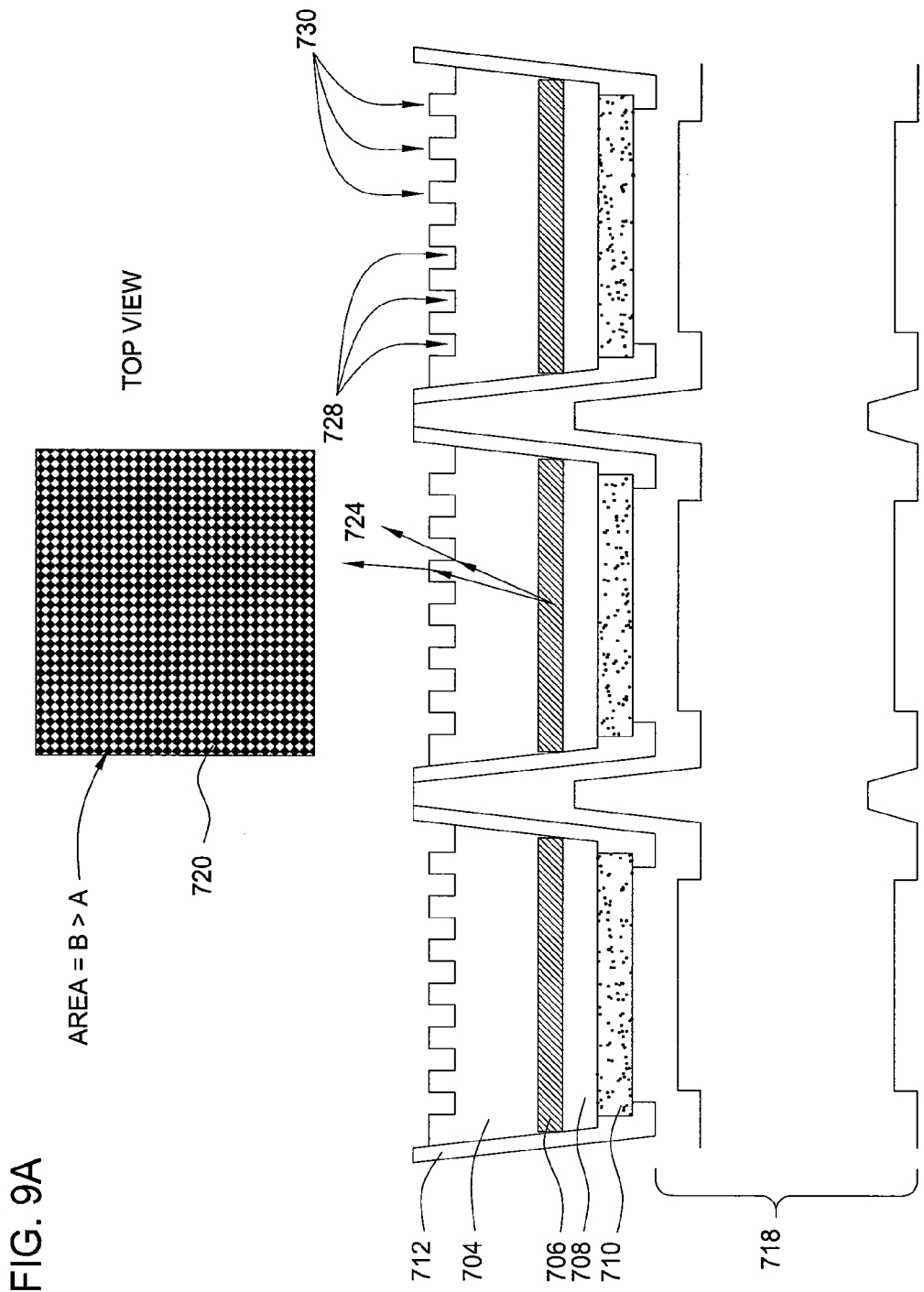

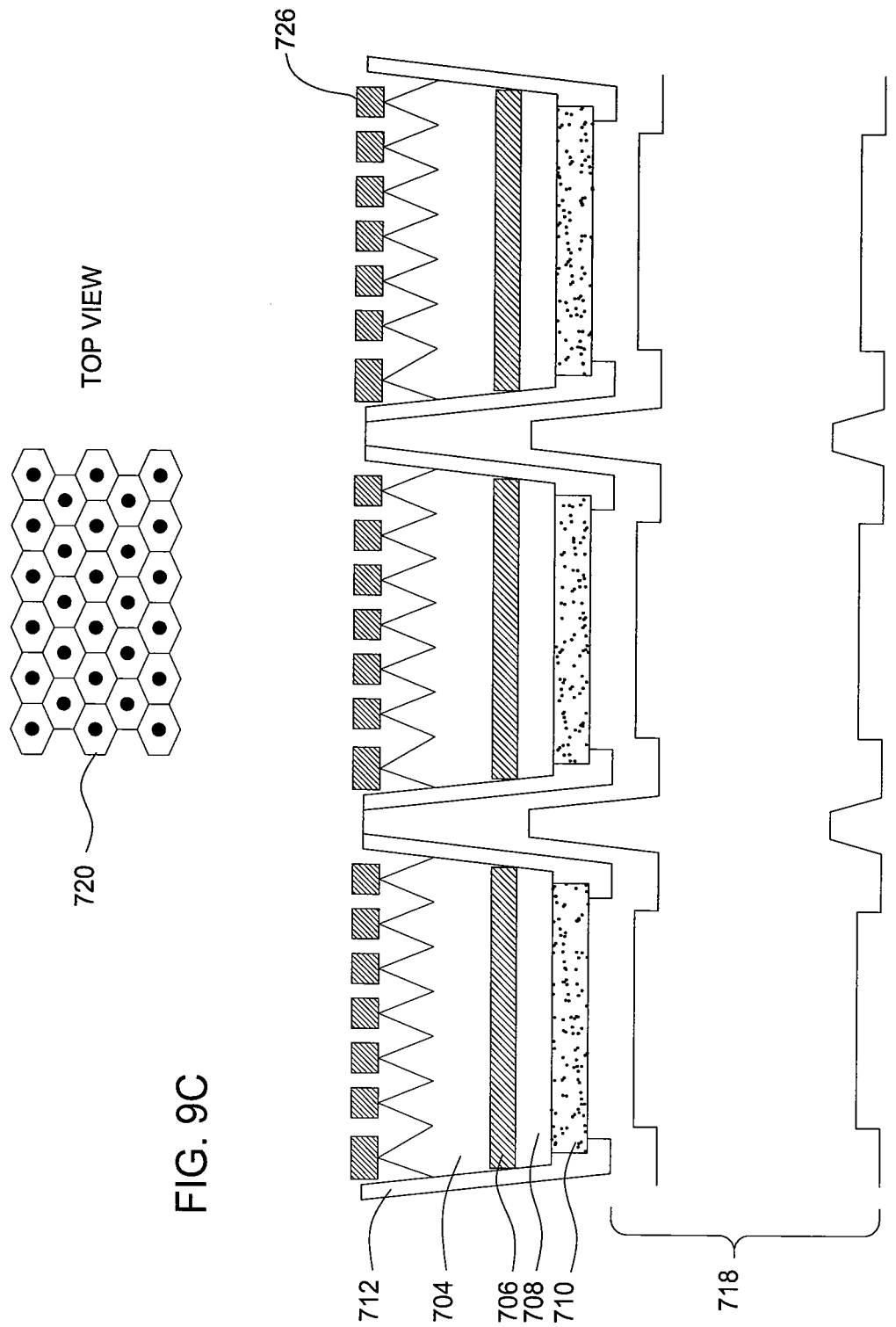

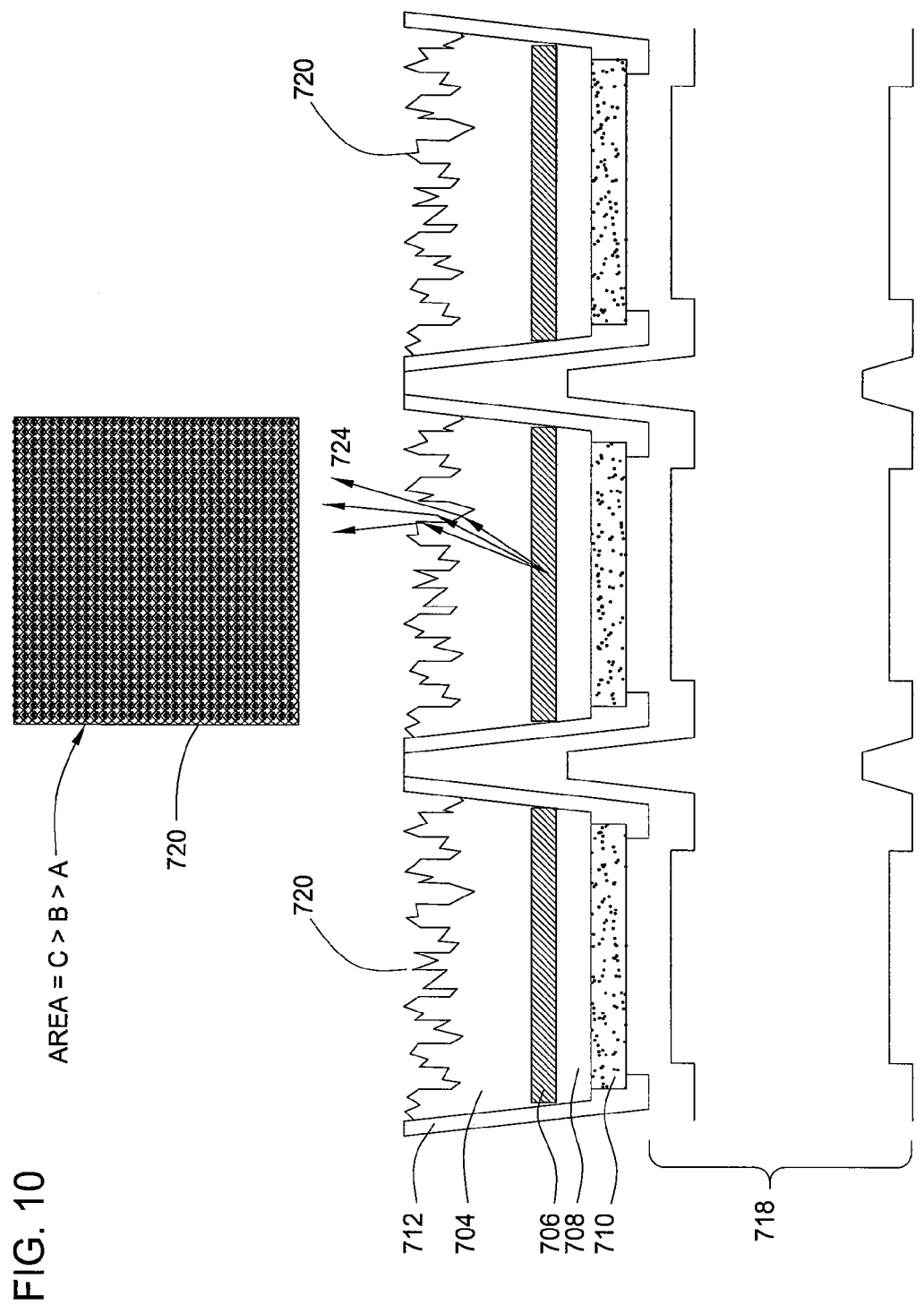

LIGHT EMITTING DIODES (LEDS) WITH IMPROVED LIGHT EXTRACTION BY ROUGHENING

CROSS-REFERENCE TO RELATED APPLICATIONS

This application is a divisional of pending U.S. application Ser. No. 11/956,962, filed Dec. 14, 2007, now U.S. Pat. No. 7,897,420, which is a continuation-in-part of co-pending U.S. application Ser. No. 11/690,443 filed Mar. 23, 2007, now U.S. Pat. No. 7,524,686, which is a continuation-in-part of U.S. application Ser. No. 11/618,468 filed Dec. 29, 2006, now U.S. Pat. No. 7,563,625, which is a continuation-in-part of U.S. application Ser. No. 11/032,880 filed Jan. 11, 2005, now U.S. Pat. No. 7,186,580, which are all herein incorporated by reference.

BACKGROUND

This invention relates to light emitting diodes and more particularly to new LED structures for enhancing their light extraction.

Light emitting diodes (LEDs) are an important class of solid state devices that convert electric energy to light. LEDs typically provide an active layer of semiconductor material sandwiched between two oppositely doped layers. When a bias is applied across the doped layers, holes and electrons are injected into the active layer where they recombine to generate light. The light generated by the active region emits in all directions and light escapes the semiconductor chip through all exposed surfaces.

As semiconductor materials have improved, the efficiency of semiconductor devices has also improved. New LEDs are being made from materials such as InAlGaN, which allows for efficient illumination in the ultraviolet to amber spectrum. Many of the new LEDs are more efficient at converting electrical energy to light compared to conventional lights and they can be more reliable. As LEDs improve, they are expected to replace conventional lights in many applications such as traffic signals, outdoor and indoor displays, automobile headlights and taillights, conventional indoor lighting, etc.

The efficiency of conventional LEDs is limited by their inability to emit all of the light that is generated by their active layer. When an LED is energized, light emitting from its active layer (in all directions) reaches the emitting surfaces at many different angles. Typical semiconductor materials have a high index of refraction ($n \approx 2.2$-3.8) compared to ambient air ($n=1.0$) or encapsulating epoxy ($n \approx 1.5$). According to Snell's law, light traveling from a region having a high index of refraction to a region with a low index of refraction that is within a certain critical angle (relative to the surface normal direction) will cross to the lower index region. Light that reaches the surface beyond the critical angle will not cross but will experience total internal reflection (TIR). In the case of an LED, the TIR light can continue to be reflected within the LED until it is absorbed. Because of this phenomenon, much of the light generated by conventional LEDs does not emit, degrading its efficiency.

One method of reducing the percentage of TIR light is to create light scattering centers in the form of random texturing on the LED's surface. The random texturing is patterned into the surface by using sub micron diameter polystyrene spheres on the LED surface as a mask during reactive ion etching. The textured surface has features on the order of the wavelength of light that refract and reflect light in a manner not predicted by Snell's law due to random interference effects. This approach has been shown to improve emission efficiency by 9 to 30%.

As discussed in U.S. Pat. No. 6,821,804, one disadvantage of surface texturing is that it can prevent effective current spreading in LEDs which have a poor electrical conductivity for the textured electrode layer, such as for p-type GaN. In smaller devices or devices with good electrical conductivity, current from the p and n-type layer contacts will spread throughout the respective layers. With larger devices or devices made from materials having poor electrical conductivity, the current cannot spread from the contacts throughout the layer. As a result, part of the active layer will not experience the current and will not emit light. To create uniform current injection across the diode area, a spreading layer of conductive material can be deposited on the surface. However, this spreading layer often needs to be optically transparent so that light can transmit through the layer. When a random surface structure is introduced on the LED surface, an effectively thin and optically transparent current spreader cannot easily be deposited.

Another method of increasing light extraction from an LED is to include a periodic patterning of the emitting surface or internal interfaces which redirects the light from its internally trapped angle to defined modes determined by the shape and period of the surface. See U.S. Pat. No. 5,779,924 to Krames et al. This technique is a special case of a randomly textured surface in which the interference effect is no longer random and the surface couples light into particular modes or directions. One disadvantage of this approach is that the structure can be difficult to manufacture because the surface shape and pattern must be uniform and very small, on the order of a single wavelength of the LED's light. This pattern can also present difficulties in depositing an optically transparent current spreading layer as described above.

An increase in light extraction has also been realized by shaping the LED's emitting surface into a hemisphere with an emitting layer at the center. While this structure increases the amount of emitted light, its fabrication is difficult. U.S. Pat. No. 3,954,534 to Scifres and Burnham discloses a method of forming an array of LEDs with a respective hemisphere above each of the LEDs. The hemispheres are formed in a substrate and a diode array is grown over them. The diode and lens structure is then etched away from the substrate. One disadvantage of this method is that it is limited to formation of the structures at the substrate interface, and the lift off of the structure from the substrate results in increased manufacturing costs. Also, each hemisphere has an emitting layer directly above it, which requires precise manufacturing.

U.S. Pat. No. 5,431,766 discloses photo-electrochemical oxidation and dissolution of silicon (Si) in the absence of water and oxygen. Etch rates and photocurrents in an anhydrous HF-acetonitrile (MeCN) solution are directly proportional to light intensity up to at least 600 mW/cm$^2$, producing a spatially selective etch rate of greater than 4 microns/min. Four electron transfer reactions per silicon molecule occur with a quantum yield greater than 3.3 due to electron injection from high energy reaction intermediates.

U.S. Pat. No. 5,793,062 discloses a structure for enhancing light extraction from an LED by including optically non-absorbing layers to redirect light away from absorbing regions such as contacts, and also to redirect light toward the LED's surface. One disadvantage of this structure is that the non-absorbing layers require the formation of undercut strait angle layers, which can be difficult to manufacture in many material systems.

U.S. Pat. No. 6,744,071 discloses a nitride semiconductor element having an opposed terminal structure, whose terminals face each other. The nitride semiconductor element includes a conductive layer, a first terminal, a nitride semiconductor with a light-emitting layer, and a second terminal, on a supporting substrate successively. The first terminal and a first insulating protect layer are interposed between the conductive layer and a first conductive type nitride semiconductor layer of the nitride semiconductor.

U.S. Pat. No. 6,821,804 discloses LEDs having light extraction structures on or within the LED to increase its efficiency. The new light extraction structures provide surfaces for reflecting, refracting or scattering light into directions that are more favorable for the light to escape into the package. The structures can be arrays of light extraction elements or disperser layers. The light extraction elements can have many different shapes and are placed in many locations to increase the efficiency of the LED over conventional LEDs. The disperser layers provide scattering centers for light and can be placed in many locations as well.

As further discussed in U.S. Pat. No. 6,821,804, another way to enhance light extraction is to couple photons into surface plasmon modes within a thin film metallic layer on the LED's emitting surface, which are emitted back into radiated modes. These structures rely on the coupling of photons emitted from the semiconductor into surface plasmons in the metallic layer, which are further coupled into photons that are finally extracted. One disadvantage of this device is that it is difficult to manufacture because the periodic structure is a one-dimensional ruled grating with shallow groove depths (<0.1 µm). Also, the overall external quantum efficiencies are low (1.4-1.5%), likely due to inefficiencies of photon to surface plasmon and surface plasmon-to-ambient photon conversion mechanisms. This structure also presents the same difficulties with a current spreading layer, as described above. Light extraction can also be improved by angling the LED chip's side surfaces to create an inverted truncated pyramid. The angled surfaces provide the TIR light trapped in the substrate material with an emitting surface. Using this approach external quantum efficiency has been shown to increase by 35% to 50% for the InGaAlP material system. This approach works for devices in which a significant amount of light is trapped in the substrate. For GaN devices grown on sapphire substrates, much of the light is trapped in the GaN film so that angling the LED chip's side surfaces will not provide the desired enhancement. Still another approach for enhancing light extraction is photon recycling. This method relies on LEDs having a high efficiency active layer that readily converts electrons and holes to light and vice versa. TIR light reflects off the LED's surface and strikes the active layer, where it is converted back to an electron-hole pair. Because of the high efficiency of the active layer, the electron-hole pair will almost immediately be reconverted to light that is again emitted in random directions. A percentage of the recycled light will strike one of the LEDs emitting surfaces within the critical angle and escape. Light that is reflected back to the active layer goes through the same process again.

SUMMARY

Systems and methods are disclosed for fabricating a semiconductor light emitting diode (LED) devices by forming an n-gallium nitride (n-GaN) layer on the LED device, and roughening the surface of the n-GaN layer to enhance light extraction from an interior of the LED device.

Implementations of the above system may include one or more of the following. The n-GaN layer of the LED wafer is roughened by photo-electrochemical oxidation and etching processes. The LED wafer includes a conductive substrate (such as Cu, W, Mo or their alloys); one or more epitaxial layers; one or more ohmic contact and reflective metal layers between the epitaxial layers and the conductive substrate (for example, Ni, Au, Pt, Cr, Ti, Pd, and Ag); a protection layer such as $SiO_2$, $Si_3N_4$, or SiON on the sidewalls of free standing LED; and n-type electrodes on the top n-GaN layer. The photo-electrochemical oxidation and etching process can be performed in a system with an aqueous solution; an illumination system; and an electrical biased system. The aqueous solution can be a combination of oxidizing agent and either acid or alkaline solutions. The oxidizing agent can be one or the combination of $H_2O_2$, $K_2S_2O_8$, among others. The acid solution can be one or more of $H_2SO_4$, HF, HCl, $H_3PO_4$, $HNO_3$, and $CH_3COOH$. The alkaline solution can be one or the mixture of KOH, NaOH, $NH_4OH$, for example. The illumination can be performed by an Hg or Xe arc lamp system with wavelength ranging among visible and ultra-violet spectrum. The illumination is exposed on the n-type III-nitride semiconductors with an intensity less than 200 mW/cm². An electrical bias can be applied to the conductive substrate and the voltage is controlled between −10 and +10 V. The oxidation-dominant, the etching-dominant or the combined reactions can be controlled to optimize the roughness of the n-GaN surface by varying the constitution of the aqueous solution, the electrical biased, and the illumination intensity. The non-ordered textured morphology also is revealed after the roughening process.

The roughening process can be applied to the exposed n-GaN of the n-GaN up vertical LED at wafer-level. After the GaN-based LED epitaxial film is transferred to a conductive substrate, the n-type electrode (such as Cr/Ni) is formed on the n-type GaN layer. The n-type metal pads not only act as ohmic contacts but also the masks for the subsequent roughening process. The roughening process, which is performed by photo-electrochemical (PEC) oxidation and etching method, follows the n-electrode metallization. The wafers are immersed into the aqueous solution under illumination and the conductive substrate is electrically biased. The aqueous solution is a combination of oxidizing agents and either acid or alkaline solutes. The roughened surface of n-type GaN would reveal non-ordered textured morphology that is unlike pyramids, cone-shaped, or semi-rounded morphologies. By varying the constitutions of solution, biased voltage, and the illumination intensity, the roughening mechanism can be controlled to oxidation-dominant or etch-dominant reaction. The RMS value of the surface roughness is controlled at 0.05 um to 2 microns. The roughened surface dimension is selected to optimally scatter light at approximately ½λ. In another implementation, the effective refractive index of the roughened surface is approximately 2.0~2.5.

Advantages of the roughened surface may include one or more of the following. The roughened surfaces create an effective rough surface on GaN to extract more light from interior. Compared with the LEDs with flat surfaces, the luminance of the LEDs with non-ordered textured surfaces can be enhanced by more than two times.

The LEDs can provide more light for the same chip size/power consumption. Alternatively, the LEDs can be made smaller given the same light output requirement and such smaller size consumes less power as well as real estate, resulting in savings. The LEDs can be fabricated with standard processing techniques making them highly cost competitive with standard LEDs.

One embodiment of the present invention is a method. The method generally includes providing a light-emitting diode (LED) wafer assembly, applying a mask to a surface of the n-doped layer, etching the surface of the n-doped layer such that etched pits are formed in the surface, removing the mask, and roughening or texturing the surface of the n-doped layer including the etched pits. The LED wafer assembly generally includes a conductive substrate, a p-doped layer disposed above the conductive substrate, an active layer disposed above the p-doped layer, and an n-doped layer disposed above the active layer.

Another embodiment of the present invention is a method. The method generally includes applying a mask to a surface of a light-emitting diode (LED) wafer, etching the surface of the LED wafer such that etched pits are formed in the surface, removing the mask, and roughening or texturing the surface of the LED wafer including the etched pits.

Yet another embodiment of the present invention is a method. The method generally includes providing an LED wafer assembly having a plurality of LED stacks disposed above a conductive substrate (each of the LED stacks typically includes a p-doped layer disposed above the conductive substrate, an active layer for emitting light disposed above the p-doped layer, and an n-doped layer disposed above the active layer); applying a protective layer covering a selected portion of a surface of the n-doped layer for each of the plurality of LED stacks; altering the surface of the n-doped layer by at least one of roughening and texturing, wherein the protective layer shields the selected portion of each of the plurality of LED stacks during the altering; and removing the protective layer.

Yet another embodiment of the present invention is a method. The method generally includes providing an LED wafer assembly having a plurality of LED stacks disposed above a conductive substrate (each of the LED stacks typically includes a p-doped layer disposed above the conductive substrate, an active layer for emitting light disposed above the p-doped layer, and an n-doped layer disposed above the active layer); applying a protective layer covering a selected portion of a surface of the n-doped layer for each of the plurality of LED stacks; immersing the surface of the n-doped layer having the protective layer applied in an electrolytic solution; applying an electrical bias to the conductive substrate; and illuminating the surface of the n-doped layer such that PEC oxidation and etching occurs to roughen the surface of the n-doped layer, wherein the protective layer shields the selected portion of each of the plurality of LED stacks during the illuminating.

Yet another embodiment of the present invention is a method. The method generally includes providing an LED wafer assembly comprising a plurality of LED dies; and selectively altering a desired portion of a light-emitting surface of each of the plurality of LED dies by at least one of roughening and texturing, wherein each of the plurality of LED dies has a remaining portion of the light-emitting surface that is excluded from the altering.

Yet another embodiment of the present invention is a method. The method generally includes providing an LED wafer assembly, applying a mask to a surface of the n-doped layer, etching the surface of the n-doped layer such that protuberances remain on the etched surface—wherein lateral surfaces of the protuberances form an angle of greater than 90° with the etched surface of the n-doped layer—removing the mask; and roughening or texturing the etched surface of the n-doped layer including the protuberances. The LED wafer assembly generally includes a conductive substrate; a p-doped layer disposed above the conductive substrate; an active layer disposed above the p-doped layer; and an n-doped layer disposed above the active layer.

Yet another embodiment of the present invention is a method. The method generally includes applying a mask to a surface of an LED wafer; etching the surface of the LED wafer such that protuberances remain on the etched surface, wherein lateral surfaces of the protuberances form an angle of greater than 90° with the etched surface of the n-doped layer; removing the mask; and roughening or texturing the etched surface of the LED wafer including the protuberances.

Yet another embodiment of the present invention provides an LED structure. The LED structure generally includes a multilayer semiconductor structure for emitting light, a surface of the structure having a plurality of protuberances, wherein lateral surfaces of the protuberances form an angle greater than 90° with the surface of the multilayer semiconductor structure. The surface of the structure and the protuberances are roughened or textured for increased surface area.

BRIEF DESCRIPTION OF THE FIGURES

FIG. 9A illustrates the surface area of the n-doped layer after etching FIG. 8 in accordance with an embodiment of the invention.

FIG. 9C illustrates the surface area of the n-doped layer after chemical wet etching FIG. 8, thereby forming hexagonal pyramid structures on the surface in accordance with an embodiment of the invention.

FIG. 10 illustrates the surface area of the n-doped layer after roughening the etched surface of FIG. 9A in accordance with an embodiment of the invention.

DESCRIPTION

Figure 1:
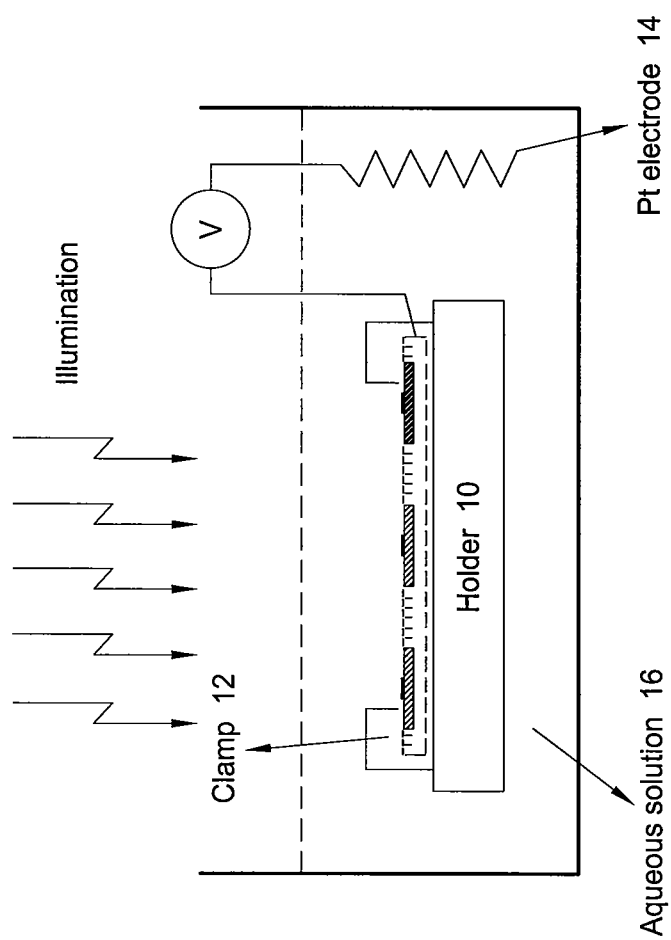
FIG. 1 shows an exemplary system to perform a photoelectrochemical oxidation and etching (PEC) process.

FIG. 1 shows an exemplary system to perform a photo-electrochemical (PEC) oxidation and etching process. The nature of the electrolytic solution is of particular importance in assuring high speed etch rates and in assuring an etch rate which is directly proportional to light intensity. The PEC etching process is carried out in a system shown in FIG. 1. In the system, light is projected by a light source onto the surface of an LED wafer resting above a holder 10 and secured by clamps 12, which is in contact with an electrolytic solution 16. The light intensity may be selectively varied to thereby selectively vary the rate of etching. The cell may have many geometric configurations and may be made of any suitable material for supporting the LED semiconductor wafer and for containing the electrolytic solution 16 having ions. The specific configuration of the cell may be optimized for high volume industrial applications. A reference electrode 14 such as a platinum electrode 14 extends into the electrolytic solution 16 through the cell body. The reference electrode 14 establishes a reference voltage $V_{ref}$ and is usually formed from a metal wire, such as a platinum or silver wire, for convenience, from a saturated calomel electrode (SCE), or from any other electrode mechanism.

The electrochemical reaction occurring in the cell is electrically powered and monitored by a potentiostat, which is well known in the art. The potentiostat comprises a current detector connected in series with a source voltage for applying a potential across the electrodes and a connection, which connects the potentiostat to the semiconductor wafer. The connection may be affixed to the semiconductor wafer via any bonding mechanism.

In the PEC etching process carried out in the system of FIG. 1, the semiconductor wafer is made part of an oxidation-reduction reaction. The semiconductor wafer is made the anode and a counter-electrode is made the cathode. A potential is applied to the semiconductor wafer. The reference electrode 14 is used in the process to measure and monitor the potential. Etching results from a decomposition reaction induced by photogenerated holes at the interface between the semiconductor wafer and the electrolytic solution 16.

Figure 2A:
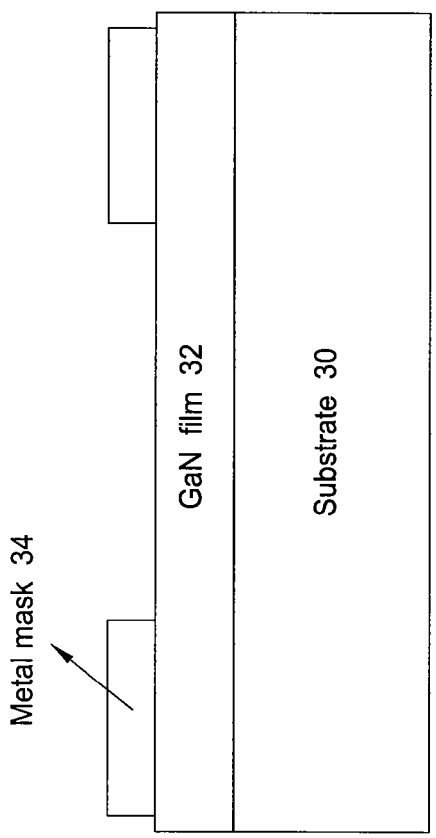
FIGS. 2A-2D show surface profiling diagrams of a first sample with metal masks under oxidation-dominant condition for various durations.
Figure 2B:
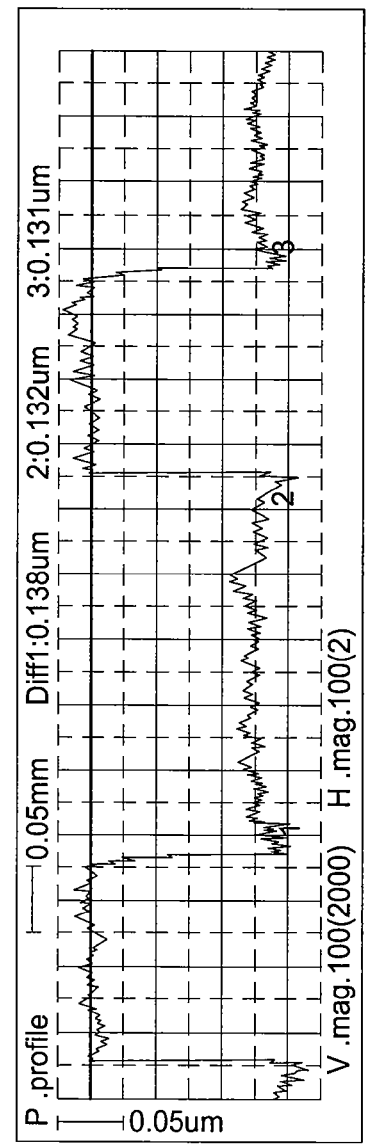
Figure 2C:
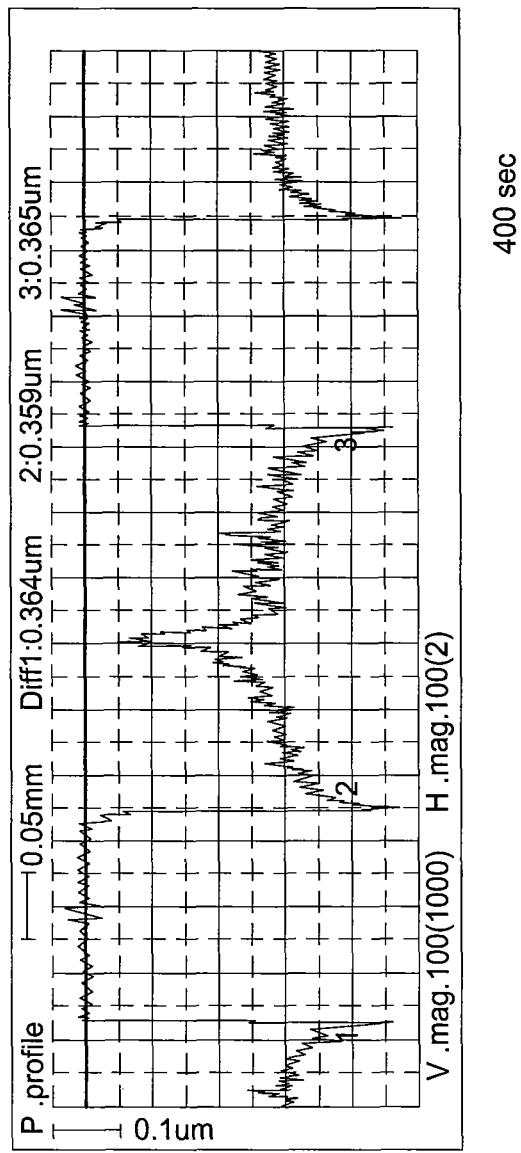
Figure 2D:
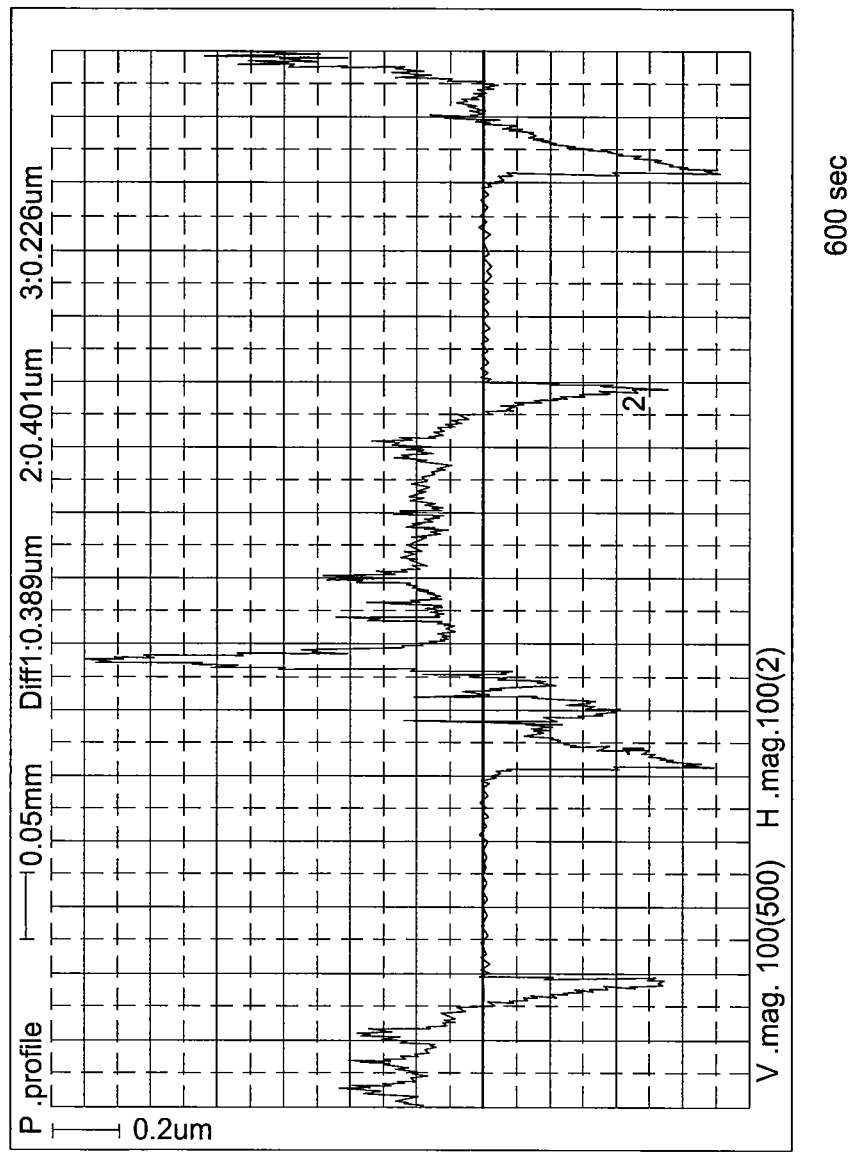
Figure 3A:
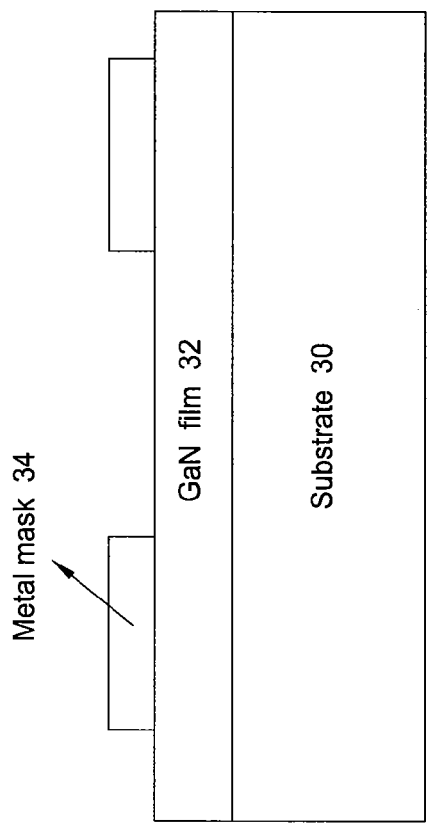
FIGS. 3A-3D show surface profiling diagrams of a second sample with metal masks under etching-dominant condition for various durations.
Figure 3B:
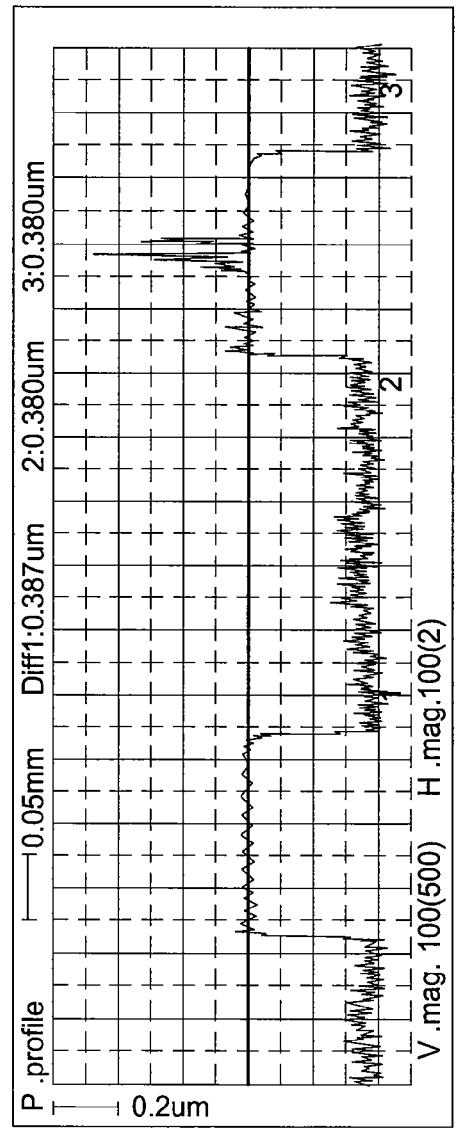
Figure 3C:
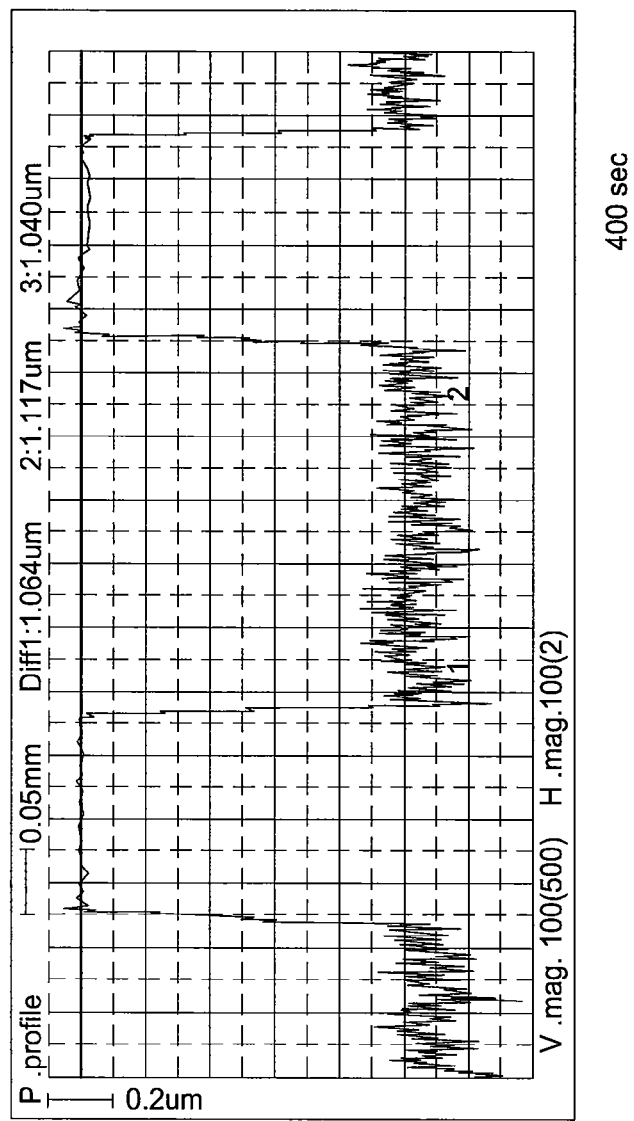
Figure 3D:
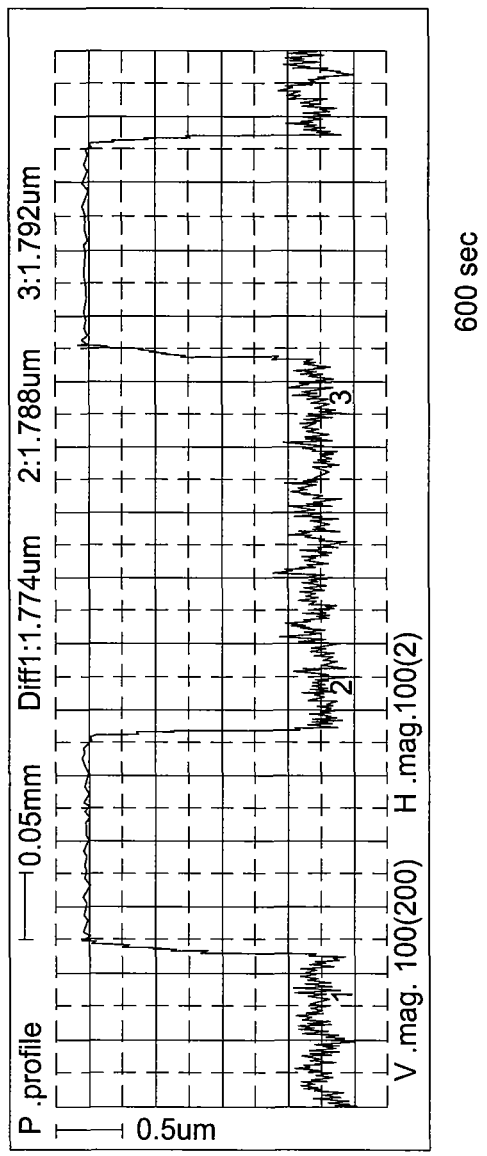

FIG. 2A shows surface profiling diagrams of a first sample with metal masks under oxidation-dominant condition for various durations. The sample wafer includes a substrate 30, a GaN film 32 and a metal mask 34 with roughened surfaces. The surface profiling diagrams of a sample with metal masks under oxidation-dominant condition for 200 seconds in FIG. 2B, 400 seconds in FIG. 2C and 600 seconds in FIG. 2D.

FIG. 3 shows surface profiling diagrams of a second sample with metal masks under etching-dominant condition for various durations. The sample wafer includes a substrate 30, a GaN film 32 and a metal mask 34 with roughened surfaces. The surface profiling diagrams of a sample with metal masks under oxidation-dominant condition for 200 seconds in FIG. 3B, 400 seconds in FIG. 3C and 600 seconds in FIG. 3D.

Figure 4:
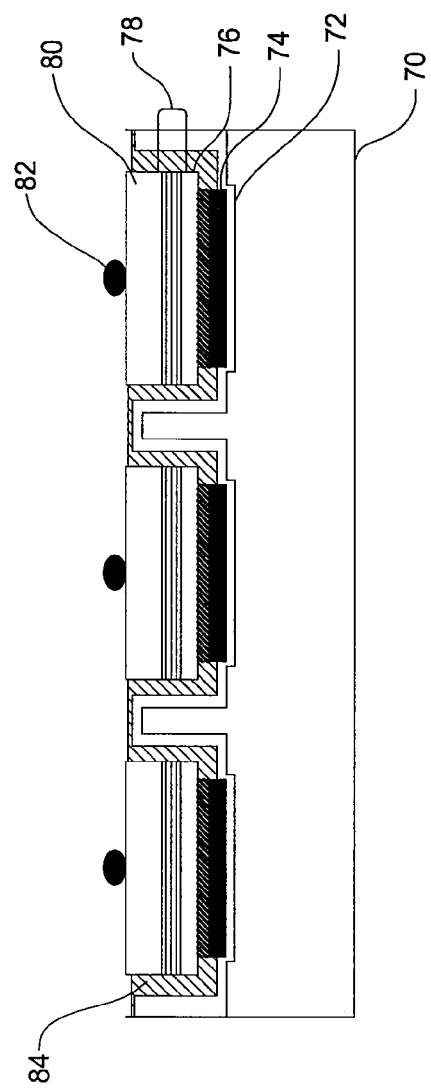
FIG. 4 shows a structure of a vertical light-emitting diode (LED) wafer with top n-GaN layer.

FIG. 4 shows a structure of a vertical-LED wafer. A multi-layer epitaxial structure of an exemplary n-GaN up LED is shown on a metal substrate 70 which can be a thick copper layer in this embodiment. The multi-layer epitaxial structure formed above the metal substrate 70 includes an n-GaN based layer 80, an MQW active layer 78 and a reflector/contact layer 74. The n-GaN based layer 80 has a thickness of 4 microns, for example.

The multi-layer epitaxial layer may be formed by depositing a n-GaN portion (e.g., n-GaN layer 80) above a carrier substrate (not shown), depositing active layers (e.g., MQW active layer 78) above the n-GaN portion, and depositing a p-GaN portion (e.g., p-GaN layer 76) above the active layers, depositing first one or more metal layers (e.g., reflector/contact layer 74), applying a masking layer (not shown), and etching the metal, p-GaN layer, active layers, and n-GaN layer. The masking may then be removed, a passivation layer (e.g., layer 84) deposited, and a portion of the passivation layer on top of the p-GaN removed to expose the first one or more metal layers. Second one or more metal layers (e.g., layer 72) may be deposited, a metal substrate (e.g., metal substrate 70) deposited, the carrier substrate (not shown) removed to expose the n-GaN portion, and the n-GaN portion roughened.

Figure 5:
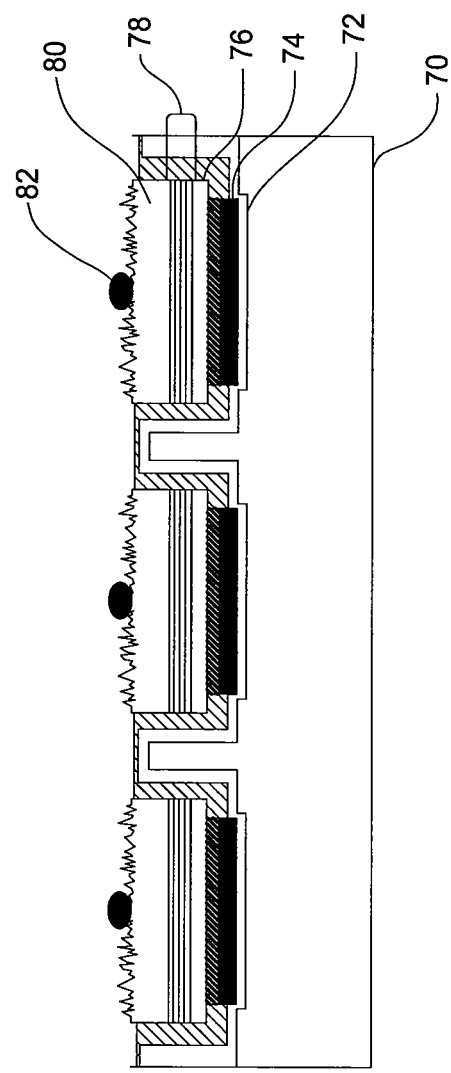
FIG. 5 shows a cross-sectional view of the vertical-LED wafer after the roughening of the exposed n-GaN layer.

The MQW active layer 78 can be an InGaN/GaN MQW active layer. Once electric power is fed between the n-GaN based layer 80 and the contact layer 74, the MQW active layer 78 may be excited and thus generates light. The produced light can have a wavelength between 250 nm to 600 nm. The p-layer 76 can be a $p^+$-GaN based layer, such as a $p^+$-GaN, a $p^+$-InGaN or a $p^+$-AlInGaN layer and the thickness thereof may be between 0.05-0.5 microns. FIG. 5 shows a cross-sectional view of the vertical-LED wafer after the roughening process. As show in FIG. 5-FIG. 6, a non-ordered textured morphology is formed on the n-GaN surface.

Figure 6:
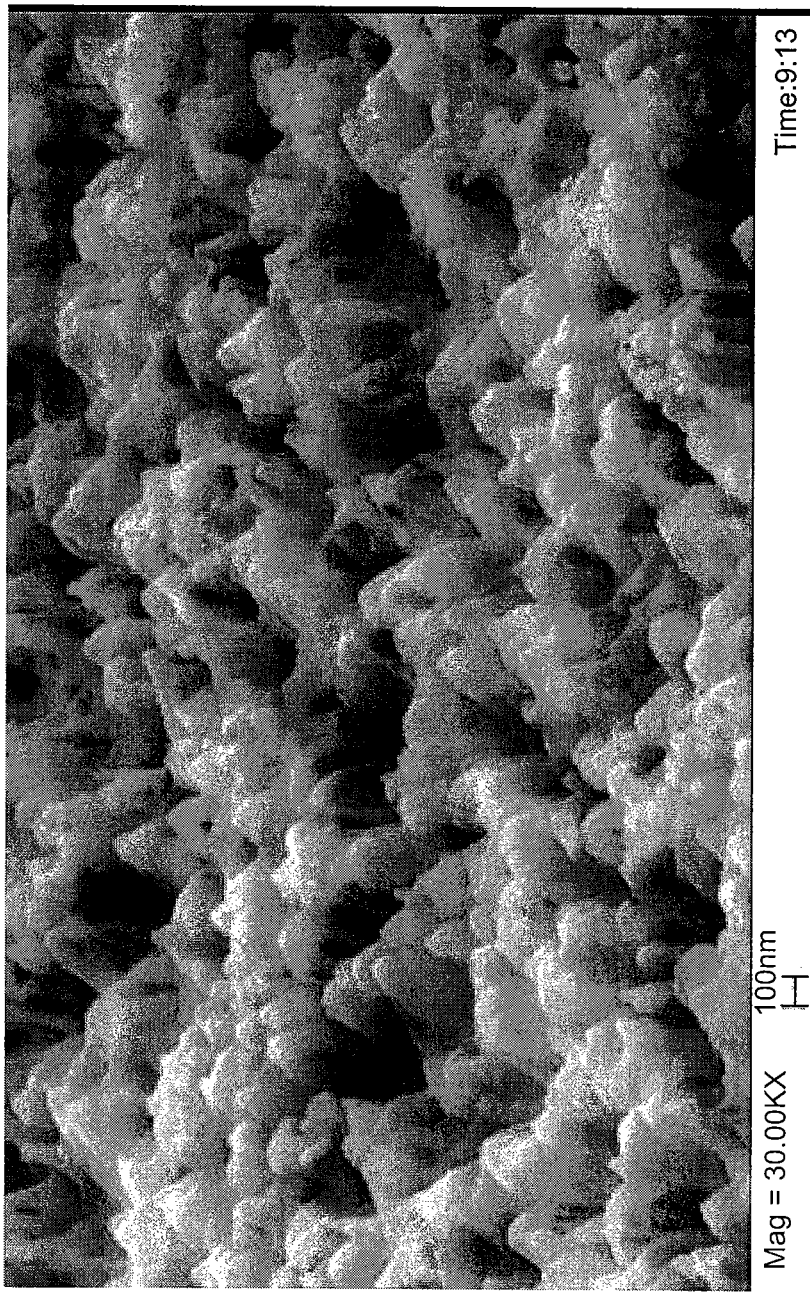
FIG. 6 is an exemplary scanning electron microscope (SEM) graph showing a non-ordered textured morphology of the n-GaN surface.

FIG. 5 shows a cross-sectional view of a roughened surface on the metal layer of the LED of FIG. 4, while FIG. 6 shows an exemplary SEM image of the roughened surface. The variations on the surface effectively roughen the surface, and leads to a better matching of the refractive index to air. As a result, the impressions enable better light extraction from the interior of the LED.

Although the present invention has been described in considerable detail with reference to certain preferred embodiments thereof, other versions are possible. In alternative embodiment, the surface of the GaN layer is roughened using balls/spheres or using wet/dry etching techniques. Other LED configurations utilizing the LEE arrays can also be envisioned by one skilled in the art. The new LED can have different combinations of LEE (light extracting element) arrays and disperser layer. LEEs can have different shapes, sizes, spaces between adjacent LEEs, and can be placed in different locations. Similarly, the disperser layers can be made of different material and placed in different location. Therefore, the spirit and scope of the appended claims should not be limited to the preferred embodiments described above.

Another Exemplary Surface Roughening Technique

Embodiments of the present invention provide techniques for increasing the light extraction from light-emitting diodes (LEDs) that may be applied while the LED semiconductor dies are disposed on a wafer or part of a wafer assembly.

These techniques may be applied to any LED wafer or wafer assembly comprising multiple dies, and the case of vertical light-emitting diode (VLED) dies is provided as an example. In the figures that follow, only three VLED dies are shown, but this is representative of multiple dies on an LED wafer.

Figure 8:
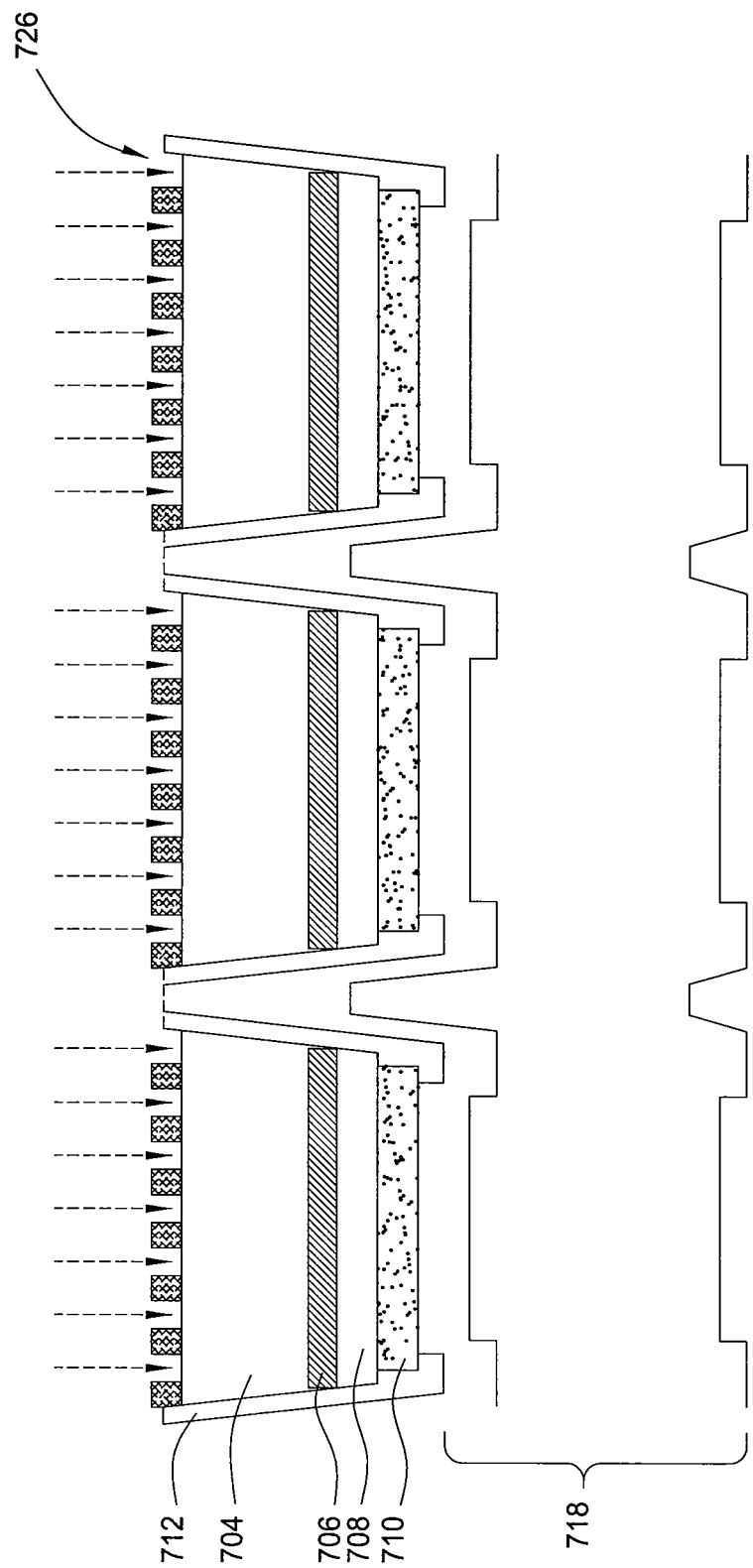
FIG. 8 illustrates applying a mask to and etching the surface of the n-doped layer in FIG. 7 in accordance with embodiments of the invention.

Referring now to FIG. 8, an LED wafer assembly 722 with a plurality of VLED dies 700 and a conductive substrate 718, or thick conductive layer (TCL), may be provided. The VLED dies 700 may comprise several compound semiconductor epitaxial layers composed of Group III/Group V chemical elements, such as GaN, AlN, InN, and the like. The conductive substrate 718 may allow for efficient thermal dissipation away from the p-n junction of the VLED dies 700, in addition to electrical conduction. Layers of the conductive substrate 718 may comprise any suitable metal or metal alloy, such as Cu, Ni, Ni—Co, Ag, Au, Cu—Co, Cu—Mo, Ni/Cu, Cu/Ni—Co/Cu, Cu/Ni—Co/Cu/Ni—Co, or Ni/Cu—Mo.

The LED wafer assembly 722 may have a reflective layer 710 disposed above the conductive substrate 718, a p-doped layer 708, such as p-GaN, disposed above the reflective layer 710, an active layer 706 for emitting light disposed above the p-doped layer 708, and an n-doped layer 704, such as n-GaN, disposed above the active layer 706. For some embodiments, the reflective layer 710 may be omitted. For some embodiments, passivation 712 may be employed between the VLED dies 700 in an effort to protect the VLED dies during die separation, for example.

At this stage, the surfaces 720 may be substantially flat, and there are most likely not many surface variations to the n-doped layer 704 when the LED wafer assembly 722 is viewed from the top or the side. Although some of the light 724 emitted from the active layer 706 may be emitted from the surface 720 of the n-doped layer at this processing stage, light 724 that reaches the surface 720 beyond the critical angle will most likely not cross and may experience total internal reflection (TIR) according to Snell's law as described above. Additional processing may be desired.

Therefore, as portrayed in FIG. 8, a mask 726 may be applied to the surfaces 720 of the n-doped layer 704, and then the surfaces 720 may be subsequently etched to enhance the surface area of the n-doped layer for increased light extraction from the VLED dies 700. Etching may be accomplished by wet etching, photoenhanced wet etching, dry etching (e.g., inductively coupled plasma/reactive ion etching (ICP/RIE)), or combinations thereof. The composition of the mask 726 may be any suitable material hard enough to withstand repeated etchings, such as Ni, $SiO_2$, $Si_3N_4$, or photoresist. The mask 726 may be patterned in any desired manner such that the surface 720 may be selectively etched. For some embodiments, the mask 726 may possess, for example, a grid, checkerboard (as shown), honeycomb, triangular, rectangular, or other shaped polygon pattern. For some embodiments, different sizes of a desired polygon or different polygons may be combined to pattern the mask 726.

After the surfaces 720 of the n-doped layer 704 have been etched, the mask 726 may be removed leaving the wafer assembly as shown in FIG. 9A. The surfaces 720 may have several etched pits 728 where material was removed, leaving several teeth 730 to form a comb-like surface in a two-dimensional cross section as shown. The checkerboard pattern of etched pits 728 and teeth 730 for the surfaces 720 is illustrated in the top view of FIG. 9A. These features may enhance the light emission rate since the surface area (B) created by the etched pits 728 and teeth 730 is greater than the surface area (A) of the n-doped layer 704 in FIG. 7. Hence, more light 724 may be extracted from the surface according to Snell's law and TIR theory at this processing stage.

Figure 9B:
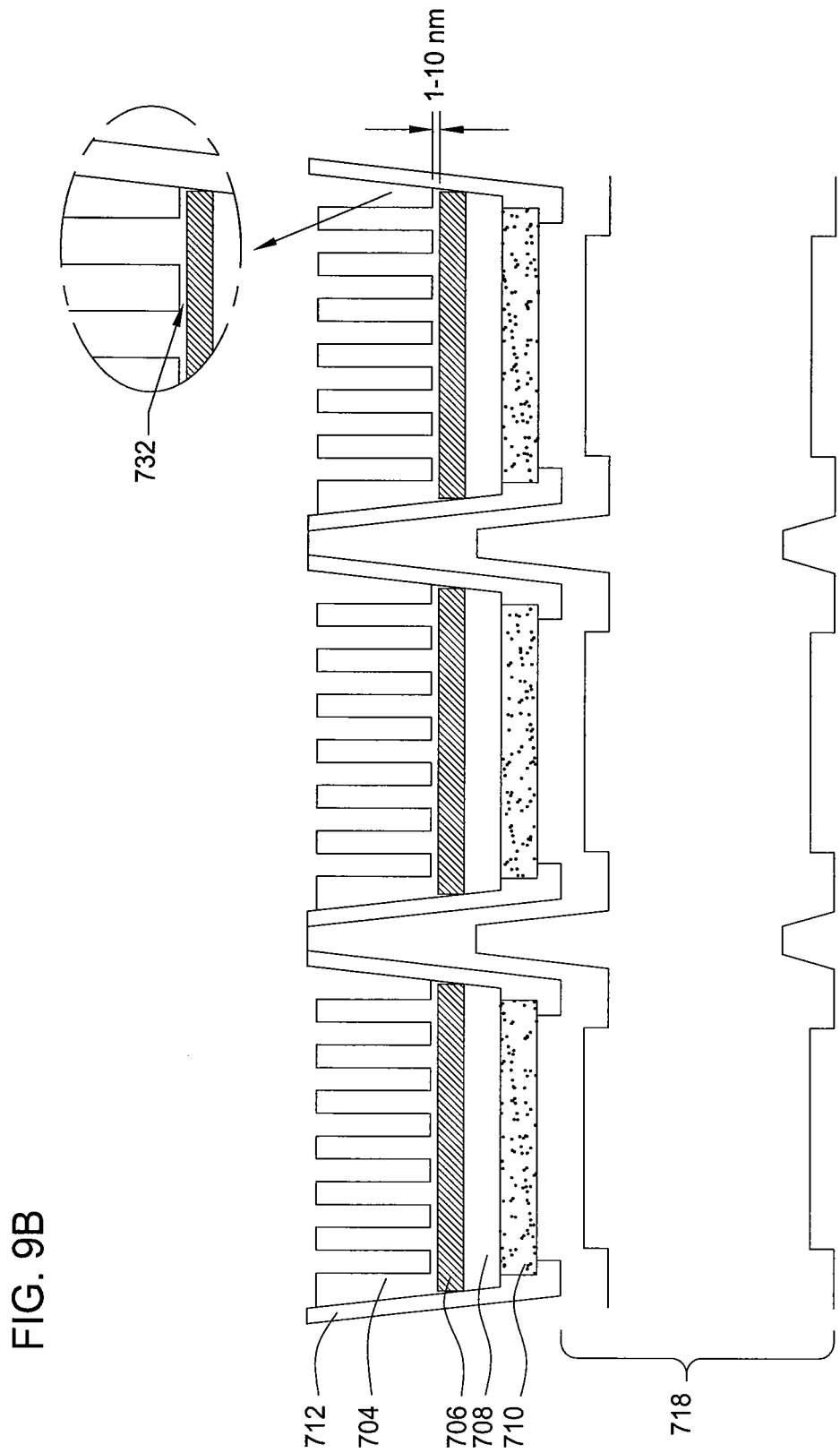
FIG. 9B illustrates surface excitation enhancement after etching FIG. 8 substantially through the n-doped layer to approach the active layer in accordance with an embodiment of the invention.

For some embodiments as illustrated in FIG. 9B, the n-doped layer 704 may be etched nearly all the way through so that the depth of the etched pits 728 may approach the active layer 706 within 1 to 10 nm. The resulting surface excitation features (SEFs) 732 may increase the density of states and the spontaneous emission rate in the LED semiconductor. The SEFs 732 may also lead to the enhancement of SEF/quantum-well coupling. Thereby, the light extraction may be further enhanced.

For other embodiments employing the mask 726 of FIG. 8, the surfaces 720 may be etched using chemical wet etching. Due to the crystallographic structure of many compound semiconductor materials used in LED fabrication, such as GaN, hexagonal pyramid structures may be formed in the n-doped layer 704 as shown in FIG. 9C. The wet etching and, hence, the dimensions of the hexagonal pyramid structures may be well-controlled.

Figure 9D:
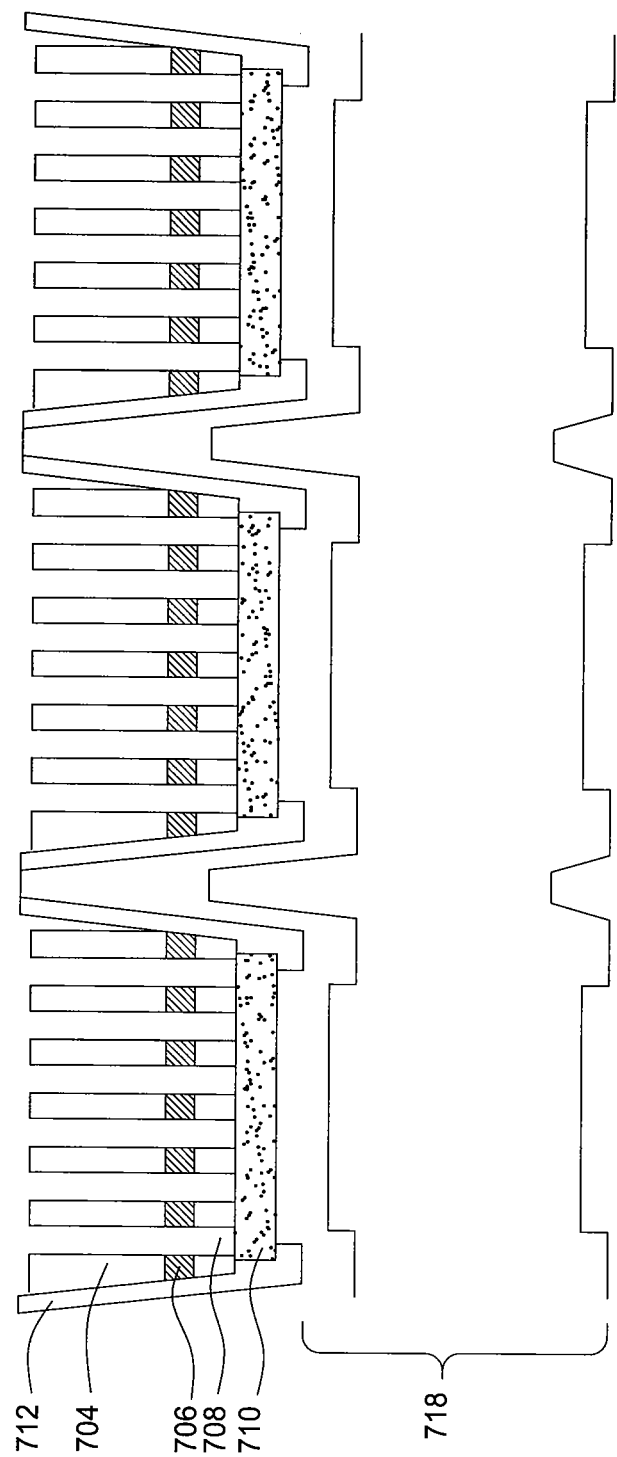
FIG. 9D illustrates the LED wafer assembly after etching FIG. 8 through the n-doped layer, the active layer, and the p-doped layer in accordance with an embodiment of the invention.

Referring now to FIG. 9D, the LED wafer assembly having the mask 726 as shown in FIG. 8 may be etched completely through the n-doped layer 704, the active layer 706, and the p-doped layer 708 for some embodiments. In this manner, micro-disk or micro-ring VLED structures may be formed. By controlling the size and periodicity of the mask 726, a nanoscale structure, such as a nanorod VLED, may be created. The micro-disk, micro-ring, and nanorod VLED structures all have enhanced surface area when compared to the surfaces 720 of the n-doped layer 704 in FIG. 7, and thus, these structures may provide increased light extraction over conventional VLED structures. For some embodiments where the n-doped layer 704 is completely etched through, the active layer 706 may be partially or completely etched through. If the active layer 706 is completely etched through, the p-doped layer 708 may be partially or completely etched through for some embodiments, Referring now to FIG. 10, the surfaces 720 of the n-doped layer 704 shown in the top view and cross-sectional views of FIG. 9A (or other embodiments described above) may be roughened or textured to increase the surface area and, thereby, the light extraction still further. For some embodiments, the surfaces 720 having the patterned etched pits 728 may be roughened by any suitable technique including wet etching, photoenhanced wet etching, dry etching, or photoelectrochemical (PEC) oxidation and etching as described above. For other embodiments, the surface area of the n-doped layer 704 may be increased by applying submicron-dimensioned objects, such as polystyrene spheres, to the surface 720 of the n-doped layer including the surfaces of the etched pits 728.

Yet Another Exemplary Surface Roughening Technique

Conventional surface roughening techniques, as well as some of the techniques disclosed herein and described above, may lead to an unstable forward voltage ($V_F$) and increased leakage current in the LED devices eventually produced from the LED wafer assembly. Embodiments of the present invention provide techniques for increasing the light extraction from LEDs without leading to forward voltage instability or increased leakage current by roughening only specific portions of the LED wafer assembly surface. Again, these techniques may be applied to any LED wafer or wafer assembly comprising multiple dies, and the case of VLED dies is provided as an example.

Figure 7:
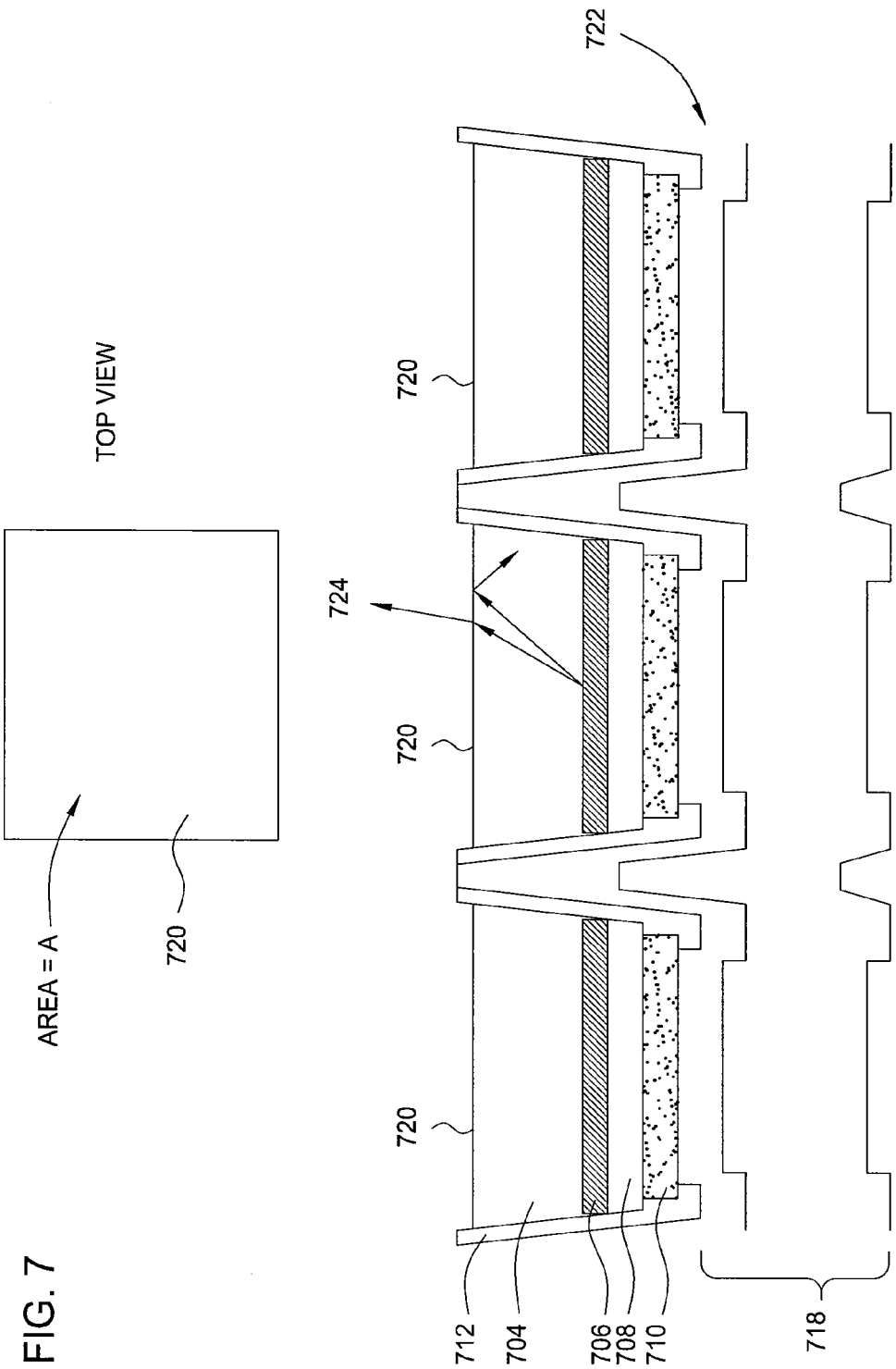
FIG. 7 illustrates the surface area of the n-doped layer of an LED wafer assembly before surface roughening and paths for emitted light in accordance with an embodiment of the invention.

Reverting to FIG. 7, an LED wafer assembly 722 with a plurality of VLED dies 700 and a conductive substrate 718 may be provided. The LED wafer assembly 722 may have a reflective layer 710 disposed above the conductive substrate 718, a p-doped layer 708 disposed above the reflective layer 710, an active layer 706 for emitting light disposed above the p-doped layer 708, and an n-doped layer 704 disposed above the active layer 706. For some embodiments, the reflective layer 710 may be omitted. The surfaces 720 of the n-doped layer 704 may be substantially flat at this stage.

Figure 11A:
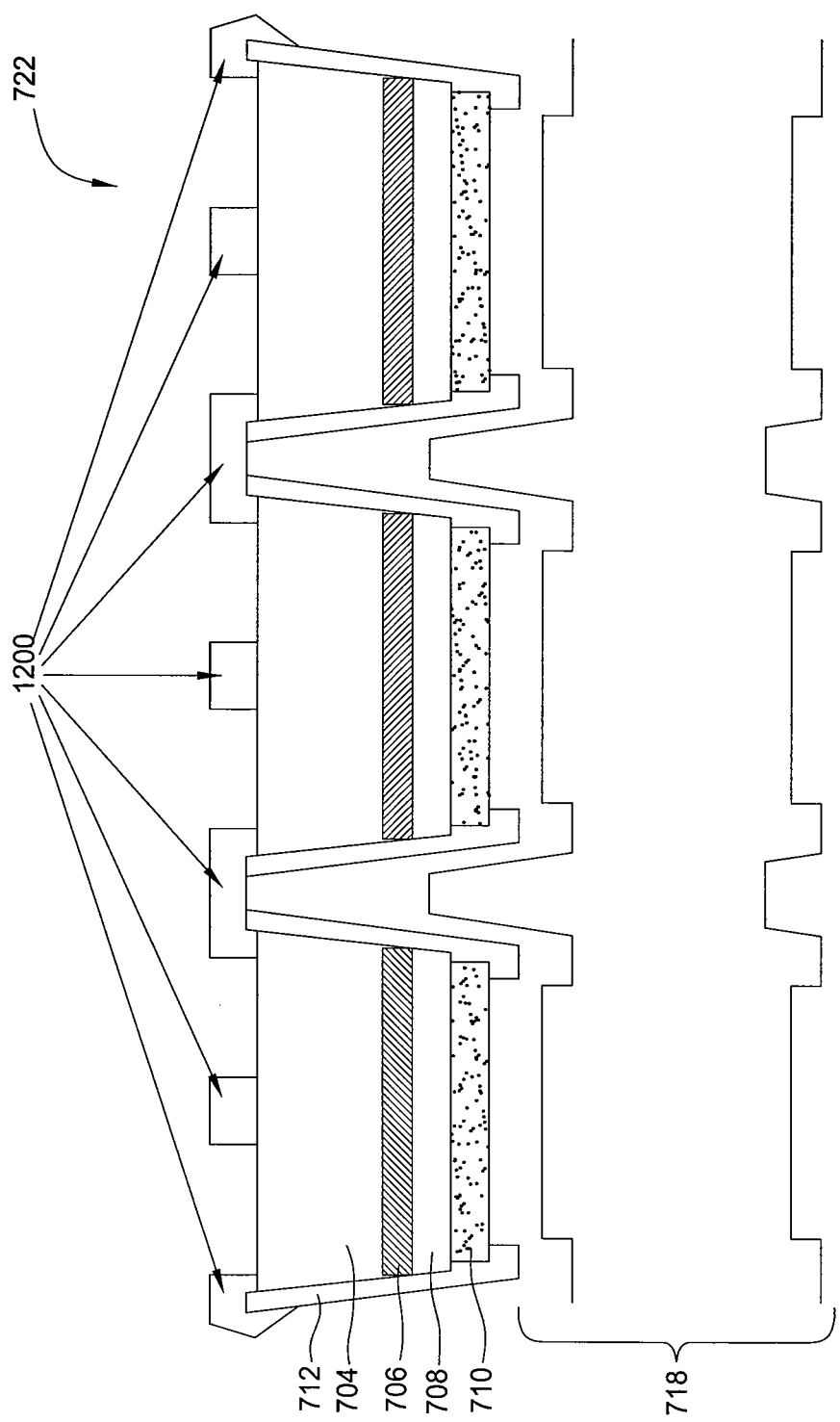
FIGS. 11A-D illustrate selectively altering the surface of the n-doped layer using a protection layer in accordance with embodiments of the invention.

Referring now to FIG. 11A, a protection layer 1200 may be added to the LED wafer assembly 722 of FIG. 7. The protection layer 1200 may be a patterned structure, such as a mask, which covers the edges of the VLED dies 700 and areas designated for the n-electrode on the surfaces 720 of the n-doped layer 704 as illustrated. For some embodiments, the protection layer 1200 may cover the edges of adjacent VLED dies 700 and the material (e.g., street areas) in between the dies 700. Designed to withstand chemical processing and protect the underlying material, the protection layer 1200 may be an organic or inorganic, photosensitive or non-photosensitive, and composed of any suitable material, such as a polymer, a polyimide, a photoresist, epoxy, SU-8, NR-7, AZ5214E, thermoplastic, $Si_3N_4$, $SiO_2$, ZnO, $Ta_2O_5$, $TiO_2$, HfO, or MgO.

Figure 11B:
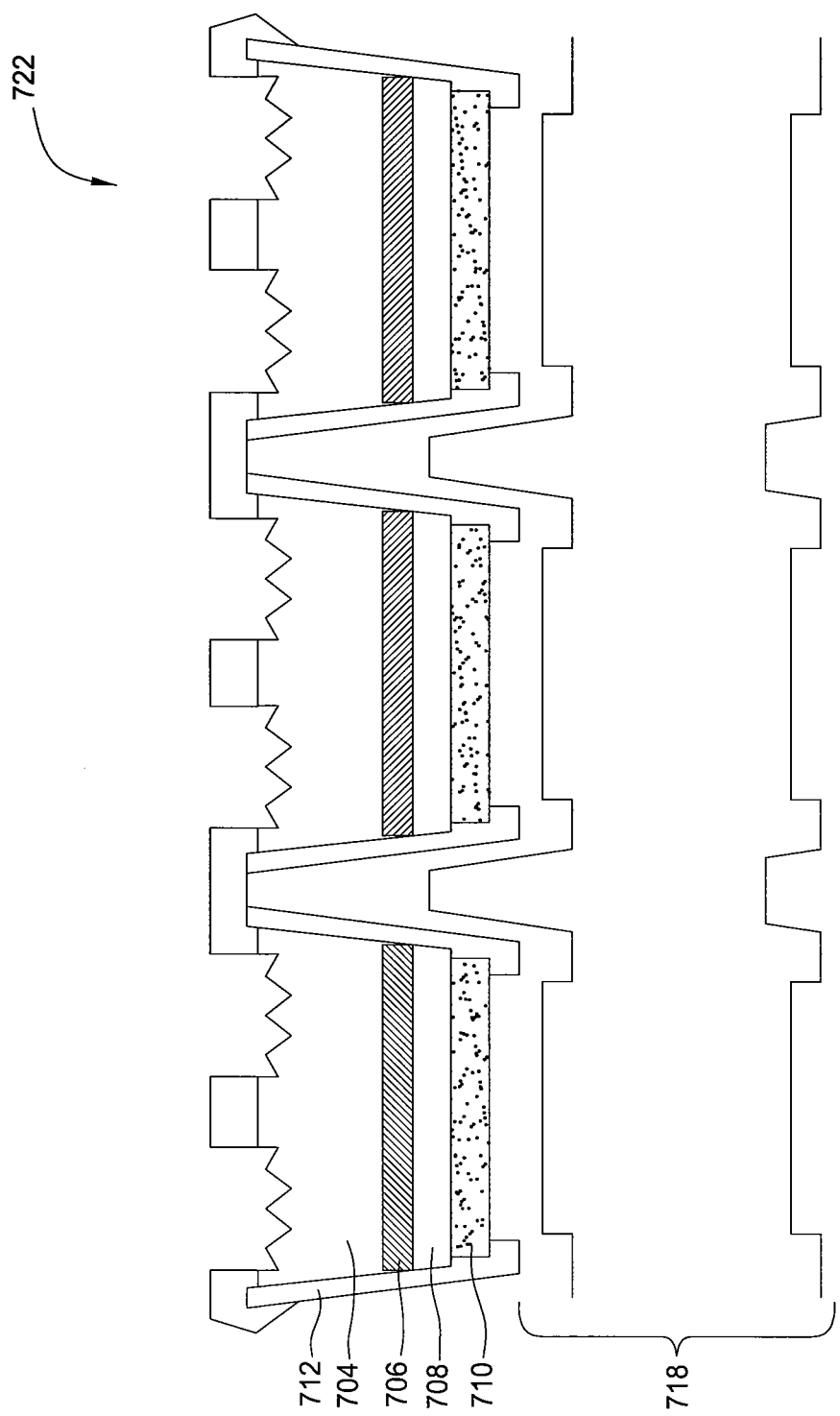

Once the protection layer 1200 has been applied to the LED wafer assembly 722, the surfaces 720 of the n-doped layer 704 may be subsequently roughened and/or textured as described above in an effort to enhance the surface area of the n-doped layer for increased light extraction from the VLED dies 700 as illustrated in FIG. 11B. Roughening and/or texturing the surfaces 720 may be accomplished by any suitable technique for increasing the surface area, such as wet etching, photoenhanced wet etching, dry etching, or photoelectrochemical (PEC) oxidation and etching as described above. The protection layer 1200 may allow for selective roughening and/or texturing of the surfaces 720 in an effort to prevent forward voltage instability and to limit the leakage current.

Figure 11C:
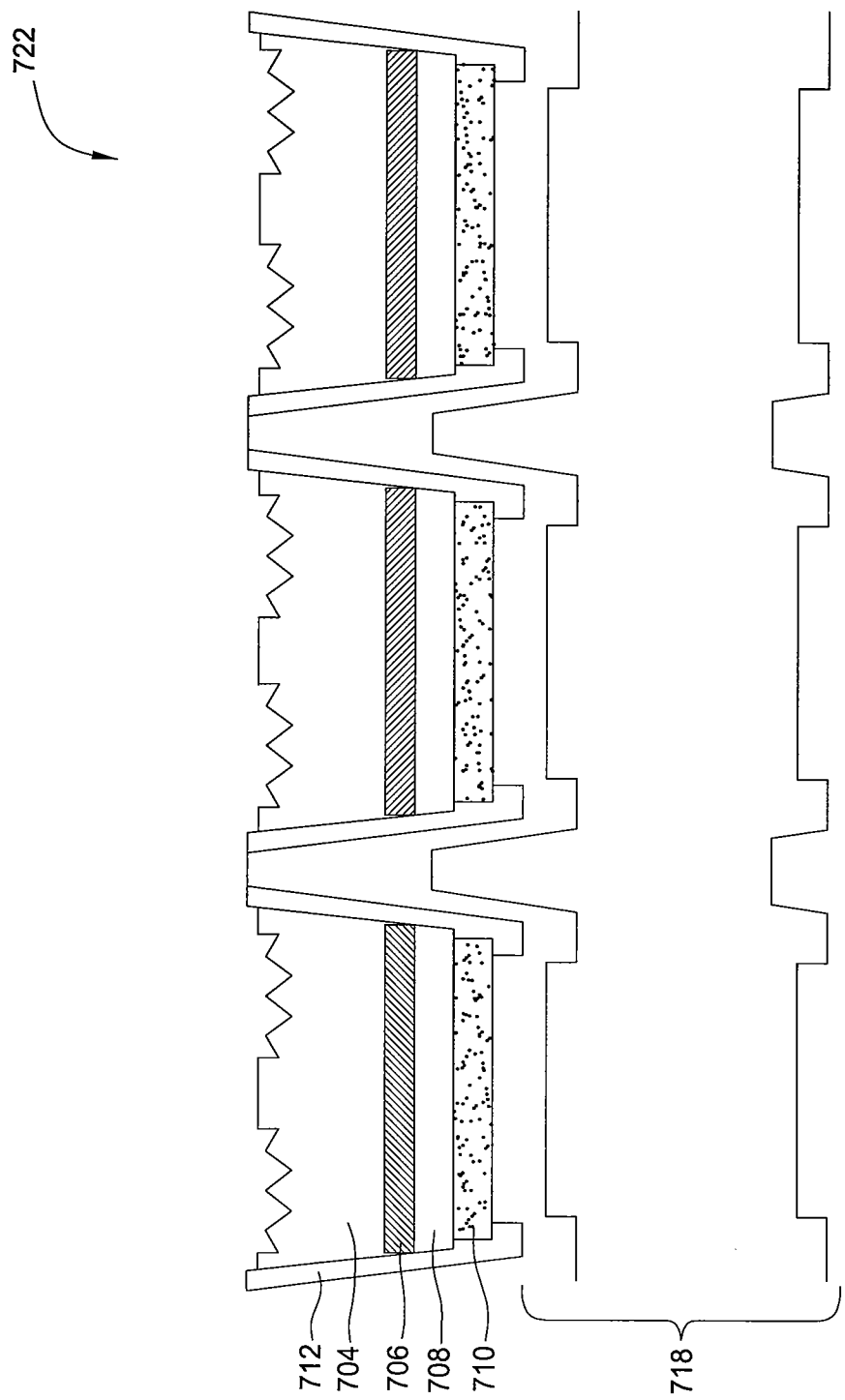
Figure 11D:
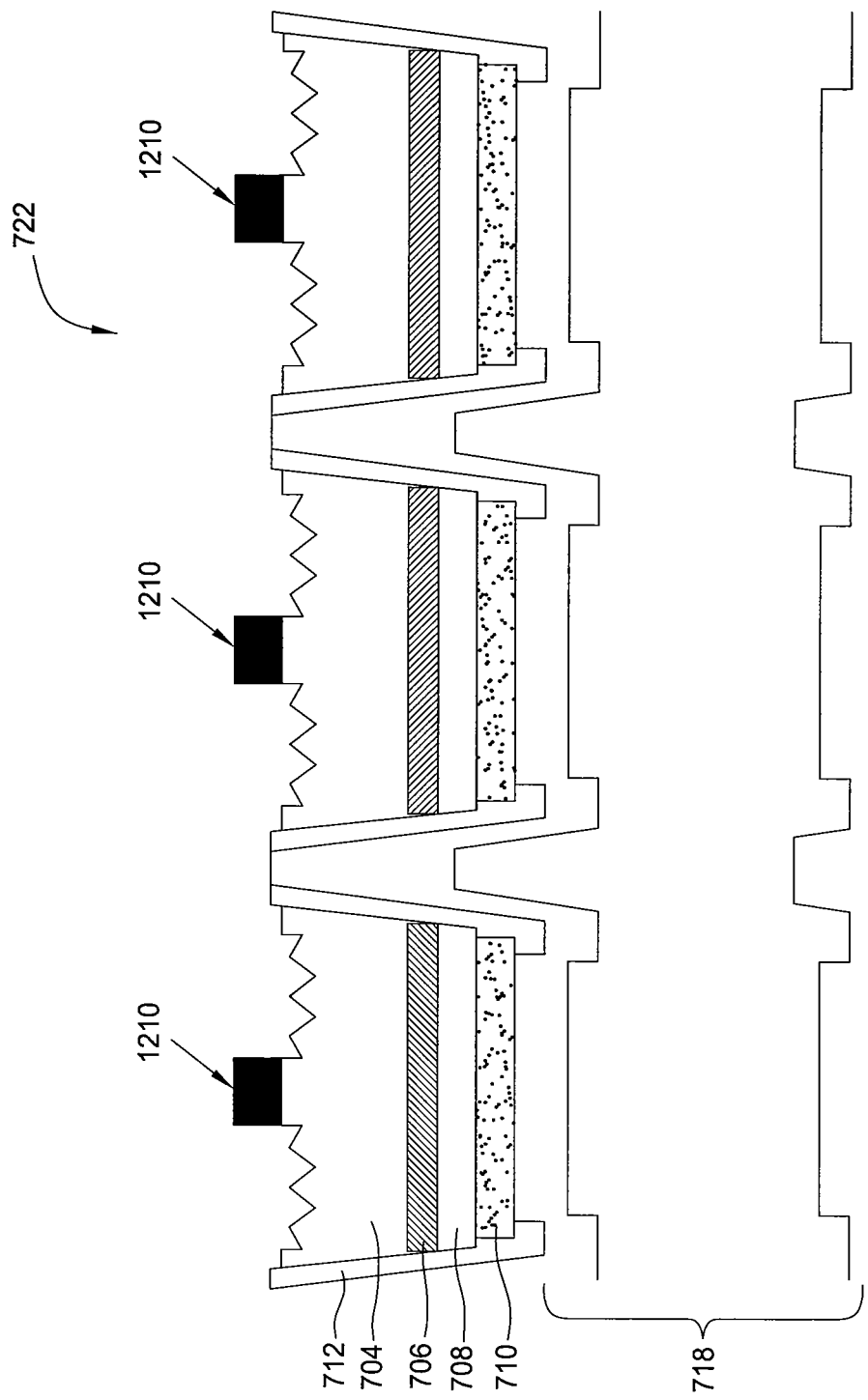

After selected surfaces of the n-doped layer 704 have been roughened and/or textured, the protection layer 1200 may be removed as depicted in FIG. 11C. Next, n-electrodes 1210 may be added to VLED dies 700 in the designated areas as shown in FIG. 11D. Designated n-electrode areas covered by the protection layer 1200 may provide a substantially flat surface for coupling to the n-electrode 1210, thereby leading to improved reliability when compared to designated areas that have been roughened according to conventional techniques. For some embodiments, the n-electrode 1210 may be formed before application of the protection layer 1200 and covered by the protection layer 1200 during roughening and/or texturing.

For other embodiments, selective roughening and/or texturing may be accomplished without the use of the protective layer 1200. For example, submicron-dimensioned objects, such as polystyrene spheres, may be applied to the surface of the LED wafer assembly 722 except in selected areas, such as the edges of the VLED dies 700 and the areas designated for the n-electrodes 1210. Other as yet unknown techniques may be envisioned to selectively roughen and/or texture specific portions of the LED wafer assembly 722.

Yet Another Exemplary Surface Roughening Technique

Figure 12:
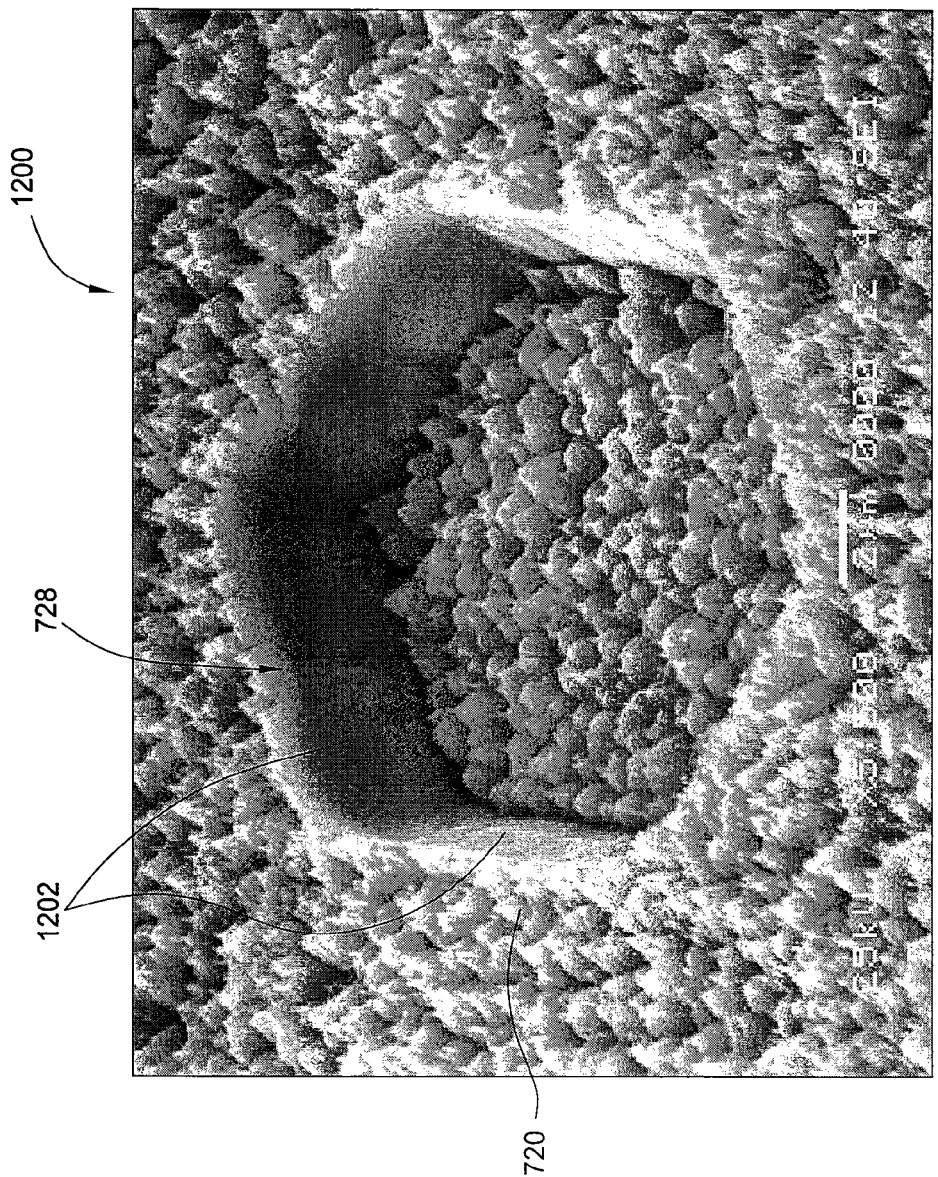
FIG. 12 is an exemplary SEM image showing an etched pit, the smooth walls of the etched pit, and the roughened surface associated with FIG. 10 in accordance with an embodiment of the invention.

With the technique of forming etched pits as described above with respect to FIGS. 8-10, the additional roughening step may increase the surface areas (and hence, the light extraction) of the surface 720 of the n-doped layer 704 and the base of the etched pit 728 when compared to conventional light-emitting diodes (LEDs). FIG. 12 is an exemplary scanning electron microscope (SEM) image 1200 illustrating one such etched pit 728 and the roughened surfaces. However, as depicted in the image 1200, the walls 1202 of the etched pits 728 are steep, forming an angle of about 90° with the base of the etched pit 728 and another angle of about 90° with the surface 720 of the n-doped layer 704. Employing the surface roughening techniques described above, the steep walls 1202 may remain relatively smooth, thereby limiting the amount of light extraction that might otherwise be achieved.

Accordingly, embodiments of the present invention provide techniques for increasing the light extraction from LEDs without forming steep walls that may be difficult to further roughen or texture. Again, these techniques may be applied to any LED wafer or wafer assembly comprising multiple dies, and the case of vertical light-emitting diode (VLED) dies is provided as an example.

Reverting to FIG. 7, an LED wafer assembly 722 with a plurality of VLED dies 700 and a conductive substrate 718 may be provided. The LED wafer assembly 722 may have a reflective layer 710 disposed above the conductive substrate 718, a p-doped layer 708 disposed above the reflective layer 710, an active layer 706 for emitting light disposed above the p-doped layer 708, and an n-doped layer 704 disposed above the active layer 706. For some embodiments, the reflective layer 710 may be omitted. The surfaces 720 of the n-doped layer 704 may be substantially flat at this stage.

Figure 13:
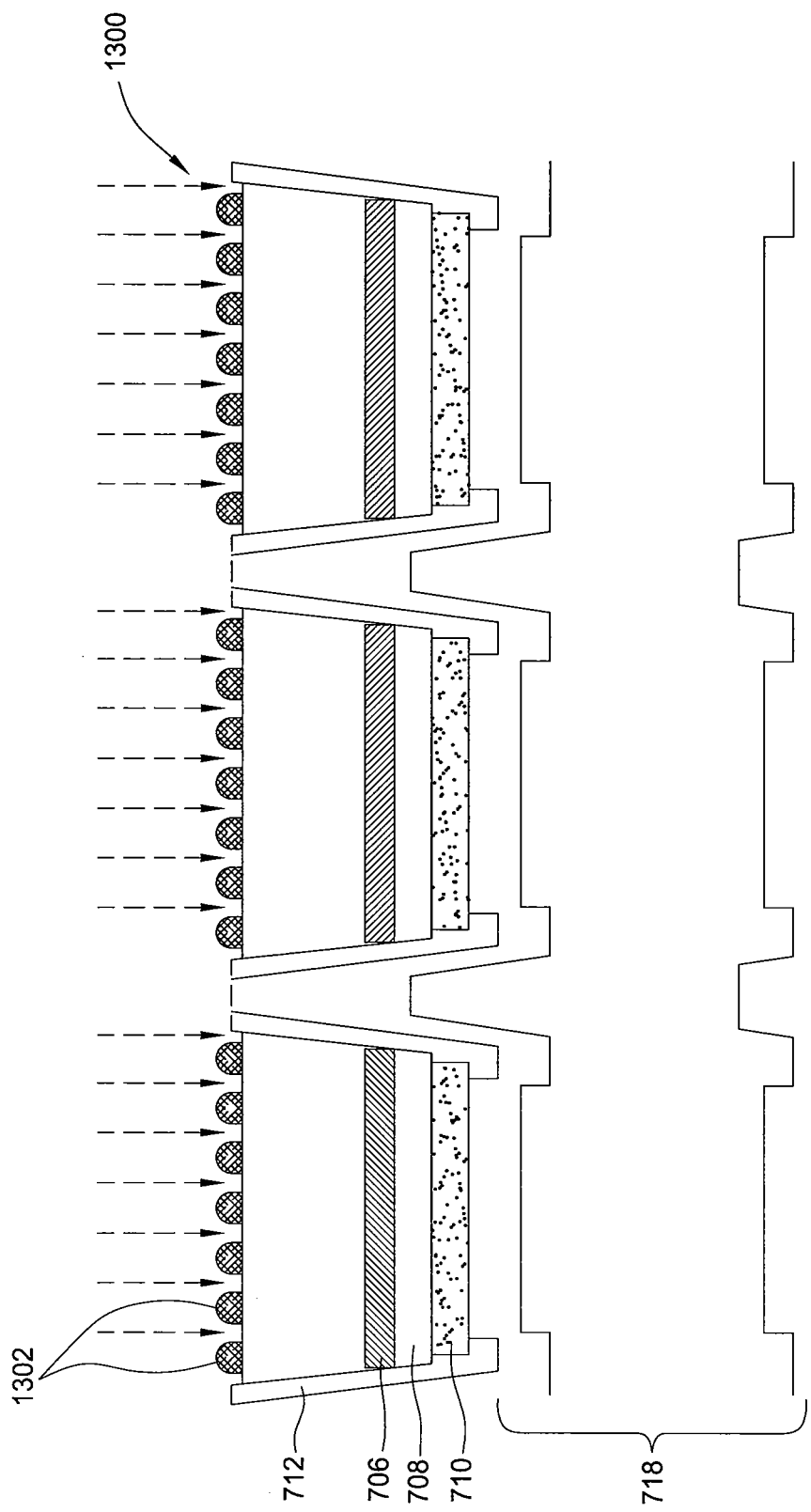
FIG. 13 illustrates applying a domed mask to and etching the surface of the n-doped layer in FIG. 7 in accordance with an embodiment of the invention.

Referring now to FIG. 13, a mask 1300 may be applied to the surfaces 720 of the n-doped layer 704 of the VLED dies 700. The mask 1300 may include a plurality of elevated hollow nubs 1302 arranged in a pattern. The hollow nubs 1302 may have any desired three-dimensional shape, such as a dome, a cuboid, a cylinder, or a prism (e.g., a hexagonal prism), and different nubs 1302 may have different shapes. The nubs 1302 may be patterned in any desired manner such that the surface 720 may be selectively etched. For some embodiments, the hollow nubs 1302 of the mask 1300 may be arranged in an array with fixed rows and columns, in a diagonal pattern, in a zig-zag pattern, in a random or seemingly random pattern, or in any other desired pattern. The composition of the mask 1300 may be any suitable material hard enough to withstand the deleterious effects of etching, such as Ni, $SiO_2$, $Si_3N_4$, photoresist, and the like. For some embodiments, the mask 1300 may be formed of a resist heat-treated to have hollow nubs 1302 of the desired shape.

After the mask 1300 has been applied to the LED wafer assembly, the surfaces 720 of the n-doped layer 704 may be subsequently etched to enhance the surface area of the n-doped layer for increased light extraction from the VLED dies 700. Etching may be accomplished by wet etching, photoenhanced wet etching, dry etching (e.g., inductively coupled plasma/reactive ion etching (ICP/RIE)), or combinations thereof. For some embodiments where the n-doped layer comprises n-doped GaN, etching may be accomplished using chlorine. As the surfaces 720 are etched, the mask 1300 may be eroded, as well. The hollow nubs 1302 of the mask 1300 may allow the semiconductor material of the n-doped layer 704 to remain and take on the shape of the hollowed out portion as etching progresses.

Figure 14A:
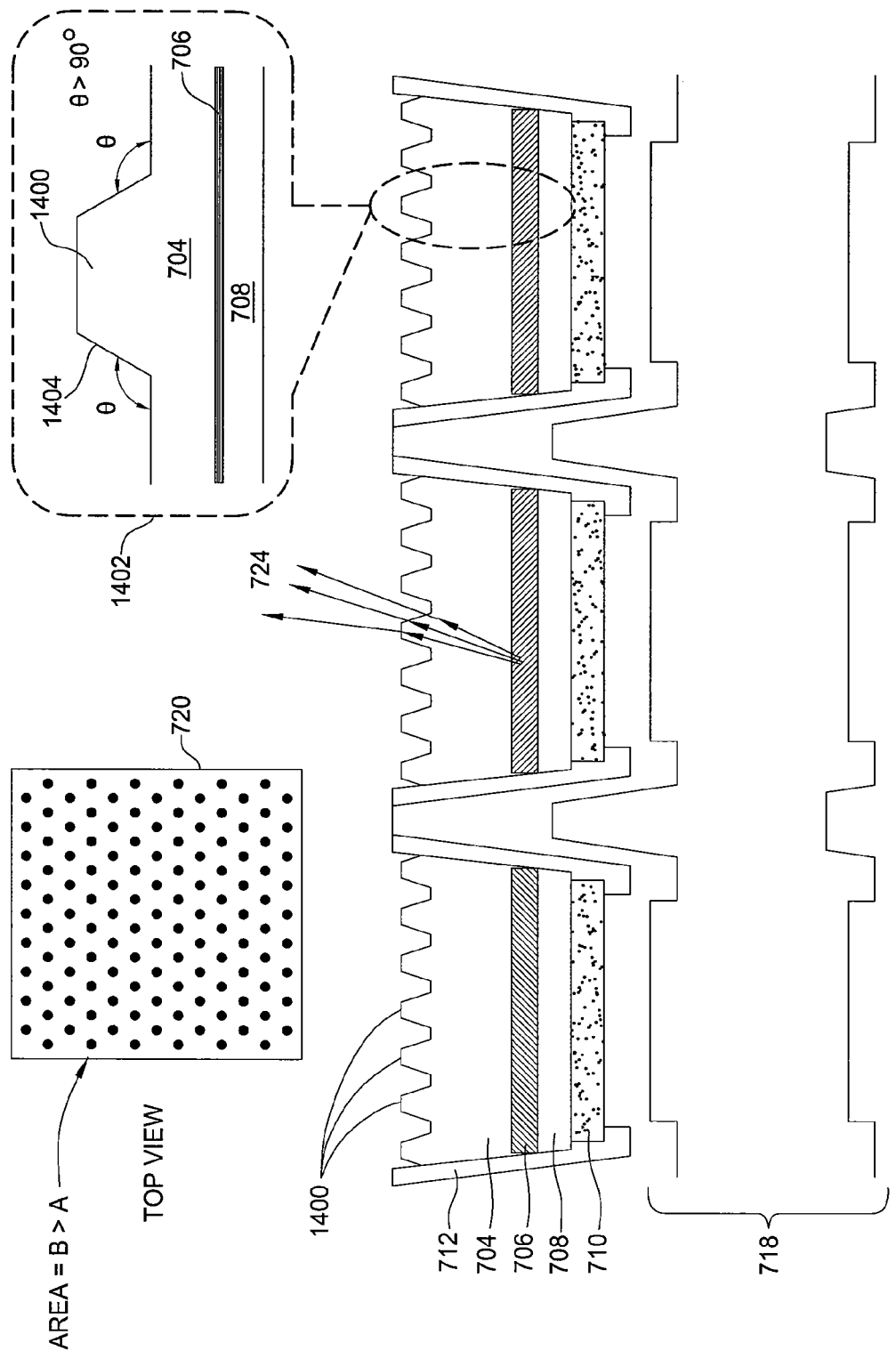
FIG. 14A illustrates the increased surface area of the n-doped layer after etching FIG. 13 and the sloped walls of the protuberances in accordance with an embodiment of the invention.

After the surfaces 720 of the n-doped layer 704 have been etched, any residual material from the mask 1300 may be removed leaving the wafer assembly as shown in FIG. 14A. The etched surfaces 720 may have several protuberances 1400 (i.e., dots, studs, bumps, or elevated portions) where semiconductor material of the multilayer epitaxial structure remained underneath the hollow nubs 1302 of the mask 1300 during etching. As etching progresses, the mask 1300 may be increasingly eroded leading to the protuberances having sloped lateral surfaces. The enlarged view 1402 of FIG. 14A illustrates the sloped lateral surfaces 1404 and how the angle θ between the etched surface and a given sloped lateral surface 1404 is greater than 90°. For some embodiments where the nubs 1302 of the mask 1300 are shaped as hollow domes, the shape of the resulting protuberances 1400 will most likely be frustums of a cone. For other embodiments where the nubs 1302 are shaped as hollow cuboids, the shape of the resulting protuberances 1400 will most likely be frustums of a rectangular pyramid.

The pattern of protuberances 1400 on the etched surfaces 720 is illustrated in the top view of FIG. 14A. These features may enhance the light emission rate since the surface area (B) created by the protuberances 1400 is greater than the surface area (A) of the essentially flat n-doped layer 704 in FIG. 7. Hence, more light 724 may be extracted from the surface according to Snell's law and total internal reflection (TIR) theory at this processing stage.

Figure 14B:
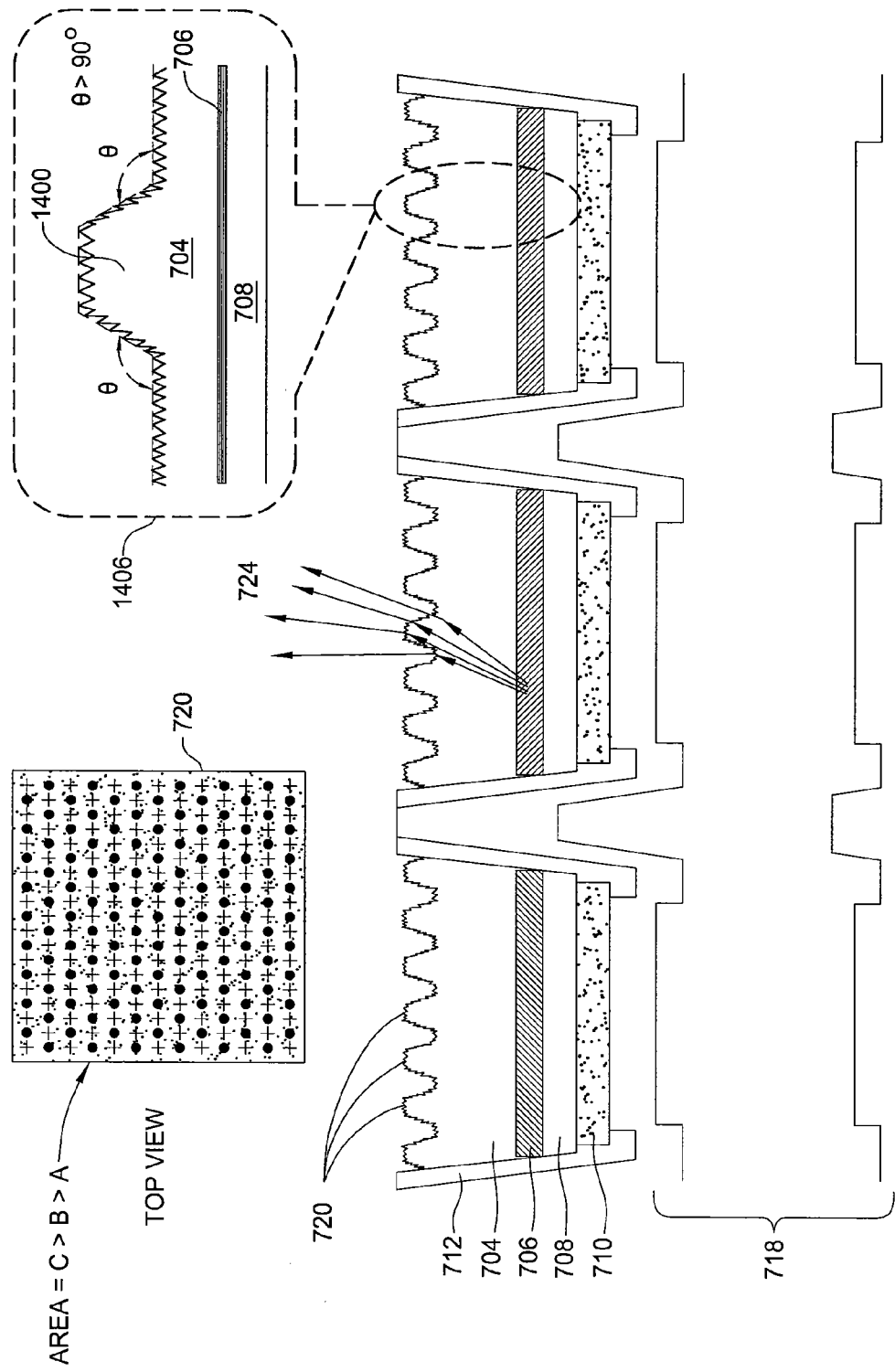
FIG. 14B illustrates the further increased surface area of the n-doped layer after roughening the etched surface with the protuberances of FIG. 14A in accordance with an embodiment of the invention.

Referring now to FIG. 14B, the etched surfaces 720 of the n-doped layer 704 shown in the top view and the enlarged view 1406 of FIG. 14A may be roughened or textured to increase the surface area and, thereby, the light extraction still further. For some embodiments, the etched surfaces 720 and the upper and lateral surfaces of the protuberances 1400 may be roughened by any suitable technique including wet etching, photoenhanced wet etching, dry etching, or photoelectrochemical (PEC) oxidation and etching as described above. For other embodiments, the surface area of the n-doped layer 704 may be increased by applying submicron-dimensioned objects, such as polystyrene spheres, to the surface 720 of the n-doped layer including the upper and sloped lateral surfaces 1404 of the protuberances 1400. Furthermore, the roughened and/or textured surface may allow for light 724 emitted from the active layer at shallower angles to escape from the emitting surfaces of the VLED dies 700.

Figure 15:
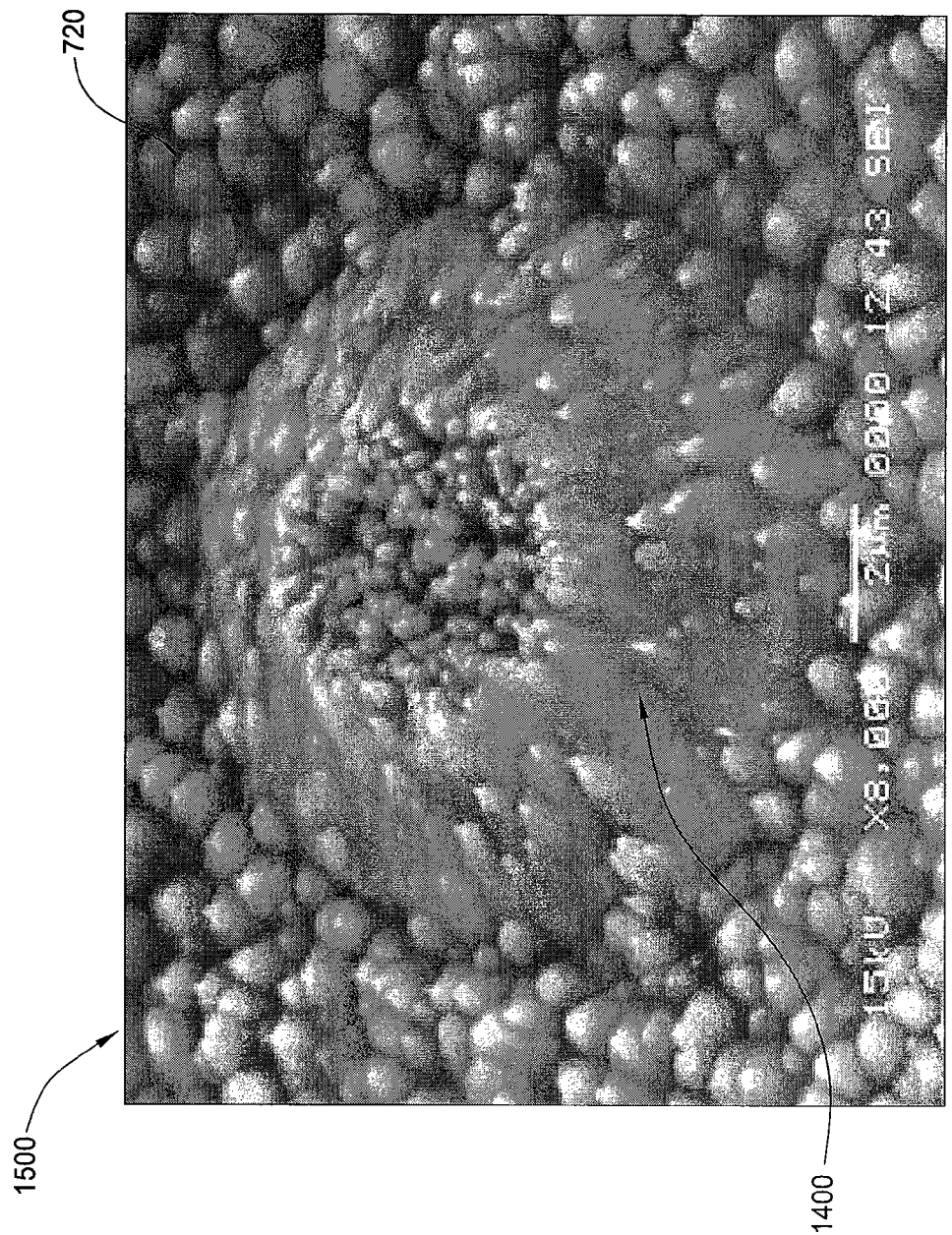
FIG. 15 is an exemplary SEM image showing a roughened protuberance associated with FIG. 14B in accordance with an embodiment of the invention.

FIG. 15 is an exemplary SEM image 1500 showing a roughened protuberance 1400, such as those in FIG. 14B. By comparing this SEM image 1500 to the SEM image 1200 of the etched pit 728, the elimination of the smooth surfaces (i.e., walls 1202) by the introduction of protuberances 1400 with sloped surfaces 1404 that have been roughened and/or textured can be observed. Therefore, embodiments of the present invention with roughened or textured protuberances may benefit from increased light extraction when compared to conventional techniques and other techniques described above.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light-emitting diode (LED) structure, comprising:
a multilayer semiconductor structure for emitting light, an upper surface of the structure having a plurality of protuberances, wherein the upper surface of the structure and surfaces of the protuberances comprise submicron-dimensioned objects; and
an electrically conductive substrate disposed beneath a lower surface of the structure.

2. The LED structure of claim 1, wherein the submicron-dimensioned objects comprise spheres.

3. The LED structure of claim 2, wherein the spheres comprise polystyrene spheres.

4. The LED structure of claim 1, wherein lateral surfaces of the protuberances form an angle greater than 90° with the upper surface of the multilayer semiconductor structure.

5. The LED structure of claim 1, wherein the protuberances comprise one of dots, studs, or bumps.

6. The LED structure of claim 1, wherein the protuberances are uniformly patterned protuberances.

7. A light-emitting diode (LED) structure, comprising:
a multilayer semiconductor structure for emitting light, an upper surface of the structure having a plurality of patterned protuberances, wherein lateral surfaces of the protuberances form an angle greater than 90° with the upper surface of the multilayer semiconductor structure and wherein the surfaces of the structure and of the protuberances comprise rough or textured surfaces; and
an electrically conductive substrate disposed beneath a lower surface of the structure.

8. The LED structure of claim 1, wherein the surfaces of the structure and of the protuberances comprise polystyrene spheres.

9. The LED structure of claim 1, wherein the multilayer semiconductor structure comprises:
a p-doped layer;
an active layer for emitting light disposed above the p-doped layer; and
an n-doped layer disposed above the active layer, such that the surface of the structure having the plurality of protuberances is a surface of the n-doped layer.

10. The LED structure of claim 1, wherein the protuberances have a shape akin to a frustum of a cone or a pyramid.

11. The LED structure of claim 1, wherein the protuberances comprise one of dots, studs, or bumps.

12. The LED structure of claim 7, wherein the electrically conductive substrate comprises a plurality of metal layers.

13. A light-emitting diode (LED) structure, comprising:
a multilayer semiconductor structure for emitting light, an upper surface of the structure having a plurality of protuberances, wherein the upper surface of the structure and surfaces of the protuberances comprise rough or textured surfaces and wherein the protuberances have a shape akin to a frustum of a cone or a pyramid; and
an electrically conductive substrate disposed beneath a lower surface of the structure.

14. The LED structure of claim 13, wherein lateral surfaces of the protuberances form an angle greater than 90° with the upper surface of the multilayer semiconductor structure.

15. The LED structure of claim 13, wherein the upper surface of the structure and the surfaces of the protuberances comprise submicron-dimensioned objects.

16. The LED structure of claim 15, wherein the submicron-dimensioned objects comprise spheres.

17. The LED structure of claim 16, wherein the spheres comprise polystyrene spheres.

18. The LED structure of claim 13, wherein the protuberances comprise one of dots, studs, or bumps.

19. The LED structure of claim 13, wherein the protuberances are patterned protuberances.

20. The LED structure of claim 13, wherein the electrically conductive substrate comprises at least one of a metal or a metal alloy.

* * * * *